(12) United States Patent
Sader

(10) Patent No.: US 9,003,726 B2
(45) Date of Patent: Apr. 14, 2015

(54) SYSTEM AND METHOD FOR ESTABLISHING A SELF-ALIGNING MOUNTING SYSTEM FOR MOUNTING PHOTOVOLTAIC MODULES

(71) Applicant: Sader Power Enterprises, LLC, New Orleans, LA (US)

(72) Inventor: Jon Dennis Sader, Franklin, MI (US)

(73) Assignee: The RAQ, LLC, Grandville, MI (US)

( * ) Notice: Subject to any disclaimer, the term of this patent is extended or adjusted under 35 U.S.C. 154(b) by 206 days.

(21) Appl. No.: 13/666,678

(22) Filed: Nov. 1, 2012

(65) Prior Publication Data

US 2013/0299659 A1 Nov. 14, 2013

Related U.S. Application Data

(60) Provisional application No. 61/559,651, filed on Nov. 14, 2011.

(51) Int. Cl.
*E04D 1/28* (2006.01)
*H01L 31/042* (2014.01)
*F24J 2/52* (2006.01)

(52) U.S. Cl.
CPC .......... *H01L 31/0422* (2013.01); *F24J 2/5245* (2013.01); *F24J 2/5205* (2013.01); *F24J 2/5258* (2013.01); *Y02B 10/20* (2013.01); *Y02B 10/12* (2013.01); *Y02E 10/47* (2013.01)

(58) Field of Classification Search
CPC .......... H01L 31/042; H01L 31/00; F24J 2/52; F24J 2/045; F24J 2/5245; F24J 2/526; F24J 2/5462; F24J 2/5264; F16M 11/00; A47B 81/00; A47B 96/00

USPC .............. 52/173.3, 29, 655.1, 741.1, 745.06, 52/745.21; 211/41.1, 183; 248/500, 148, 248/220.21, 231.85, 237, 299.1; 126/570–571, 621, 623, 245, 704; 136/251, 259, 243–245

See application file for complete search history.

(56) References Cited

U.S. PATENT DOCUMENTS

| 6,584,737 | B1 * | 7/2003 | Bradley, Jr. .................. 52/173.3 |
| D496,249 | S | 9/2004 | Liebendorfer |
| 7,260,918 | B2 | 8/2007 | Liebendorfer |
| 7,434,362 | B2 | 10/2008 | Liebendorfer |
| 7,600,349 | B2 | 10/2009 | Liebendorfer |

(Continued)

OTHER PUBLICATIONS

PCT International Search Report for International Application PCT/US2012/063475, search report data of mailing Mar. 4, 2013.

*Primary Examiner* — Beth Stephan
(74) *Attorney, Agent, or Firm* — Daniel W. Roberts; Law Offices of Daniel W. Roberts, LLC

(57) ABSTRACT

Provided are a system and method for a self-aligning system for mounting at least one photovoltaic module to a surface. The system includes a plurality of rails, each rail having a plurality of slideably attached friction locking retainers, and a plurality of anchors with fasteners extending opposite from friction locking retainers. A collapsible separator is coupled between the rails and structured and arranged to align the rails to each other at a pre-defined separation distance. Each friction locking retainer structured and arranged to laterally slide along a portion of each rail and remain as positioned by a user. Each friction locking retainer further structured and arranged to grip and permit adjustment of at least one photovoltaic module during mounting. An associated method of use is also provided.

50 Claims, 17 Drawing Sheets

(56) References Cited

U.S. PATENT DOCUMENTS

| | | | |
|---|---|---|---|
| 7,748,175 B2 | 7/2010 | Liebendorfer | |
| 7,766,292 B2 | 8/2010 | Liebendorfer | |
| 7,780,472 B2 | 8/2010 | Lenox | |
| D627,717 S | 11/2010 | Munoz et al. | |
| 7,921,843 B1 | 4/2011 | Rawlings | |
| 2006/0156648 A1* | 7/2006 | Thompson et al. | 52/173.3 |
| 2008/0010915 A1* | 1/2008 | Liebendorfer | 52/173.3 |
| 2009/0232616 A1 | 9/2009 | Sekreta | |
| 2009/0250580 A1 | 10/2009 | Strizki | |
| 2010/0101624 A1* | 4/2010 | Fioretti et al. | 136/244 |
| 2010/0237028 A1* | 9/2010 | Cusson | 211/41.1 |
| 2010/0263297 A1 | 10/2010 | Liebendorfer | |
| 2010/0276558 A1* | 11/2010 | Faust et al. | 248/222.14 |
| 2010/0293874 A1 | 11/2010 | Liebendorfer | |
| 2010/0307991 A1* | 12/2010 | Belikoff et al. | 211/41.17 |
| 2010/0319277 A1 | 12/2010 | Suarez et al. | |
| 2011/0154774 A1 | 6/2011 | Rawlings | |
| 2012/0090665 A1* | 4/2012 | Zuritis, Michael | 136/251 |
| 2012/0152326 A1* | 6/2012 | West et al. | 136/251 |
| 2012/0199181 A1* | 8/2012 | Newman et al. | 136/251 |

* cited by examiner

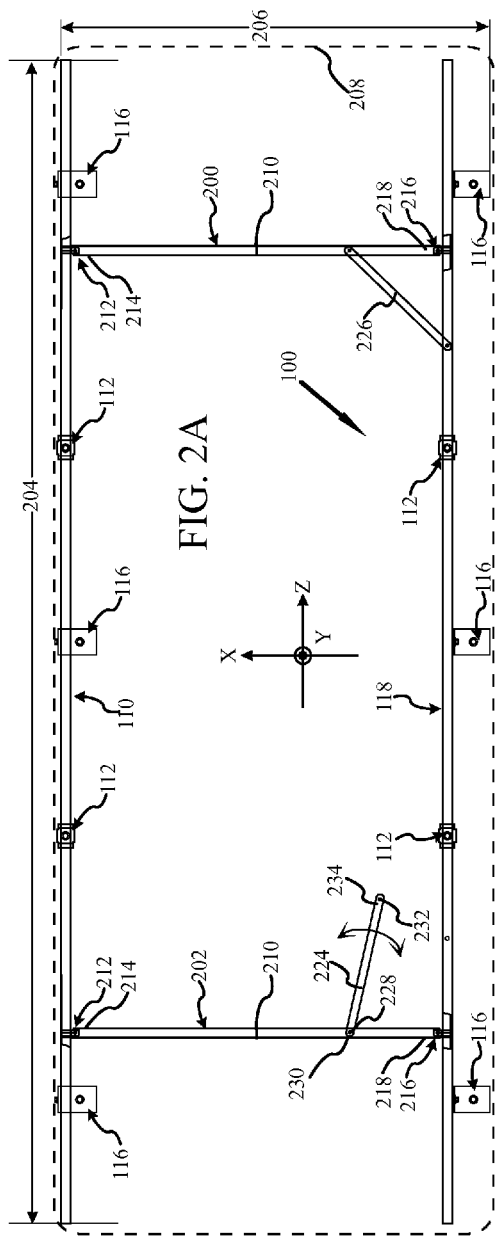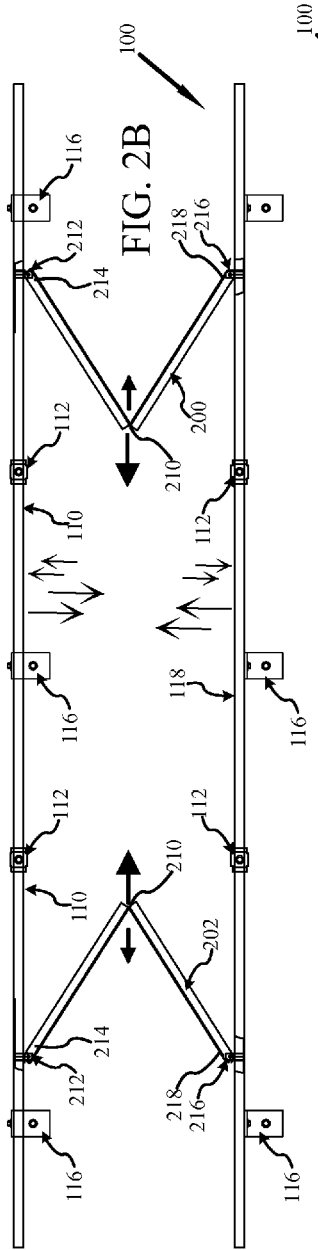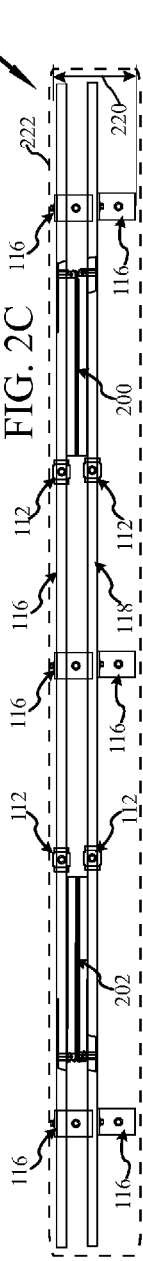

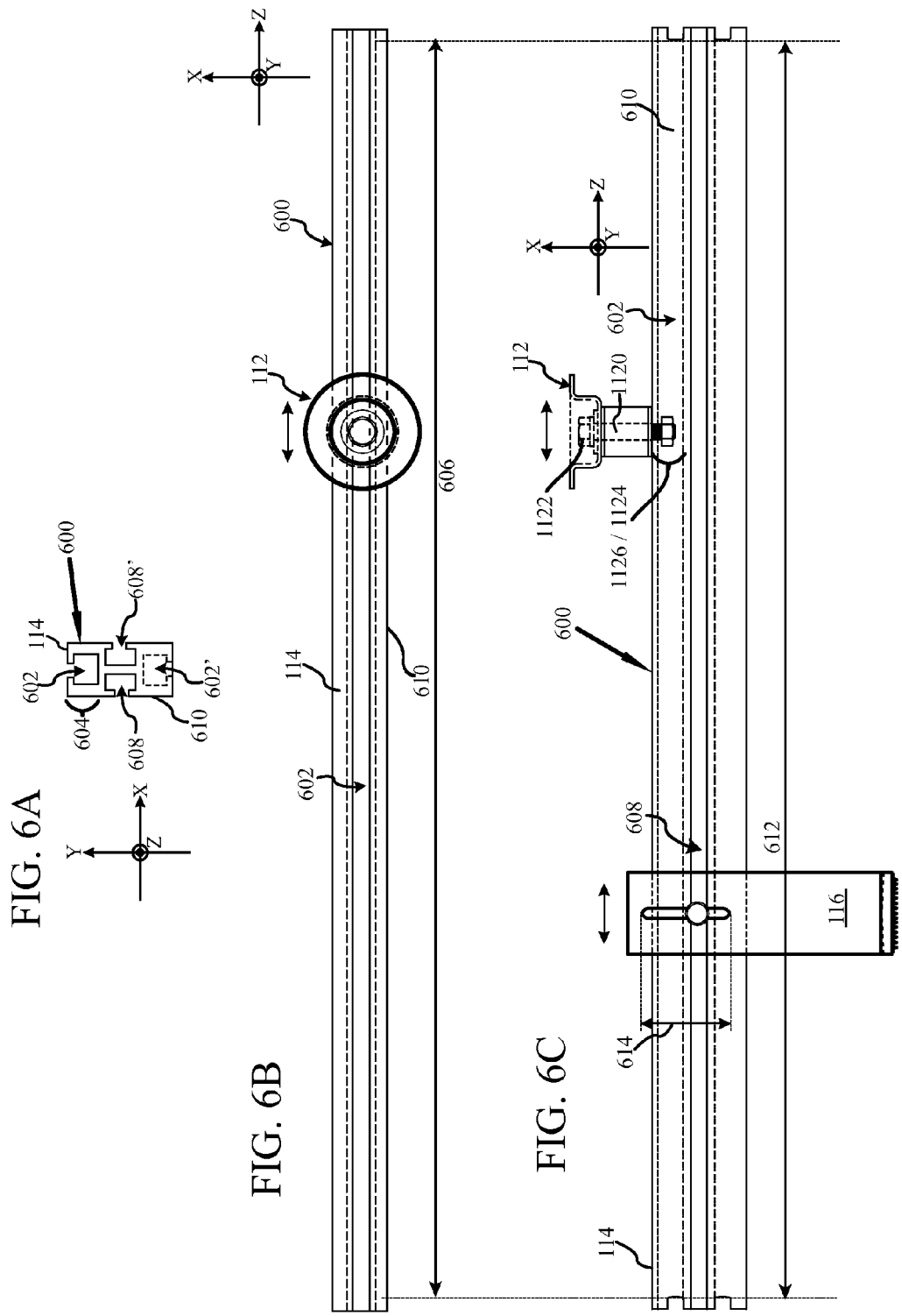

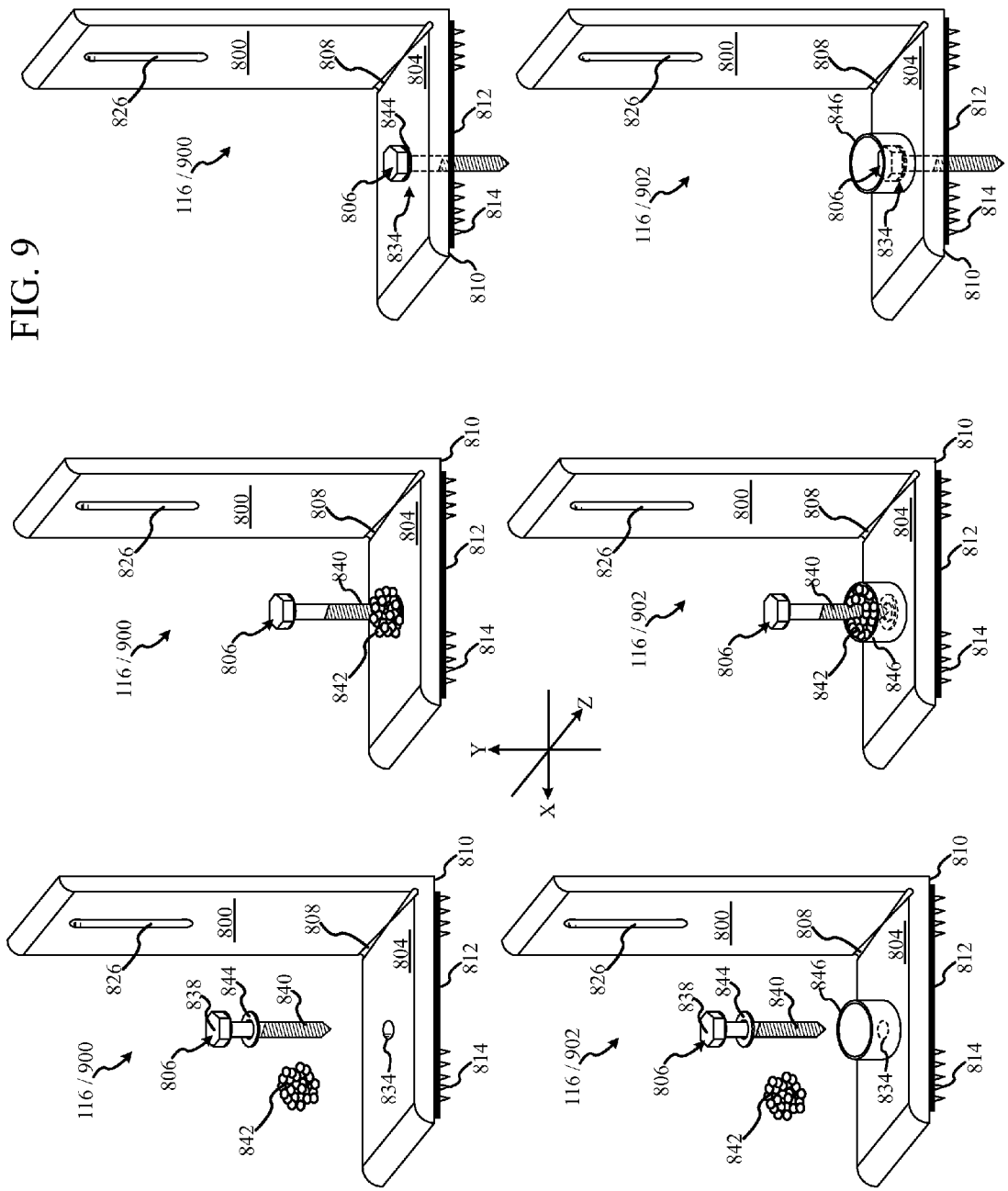

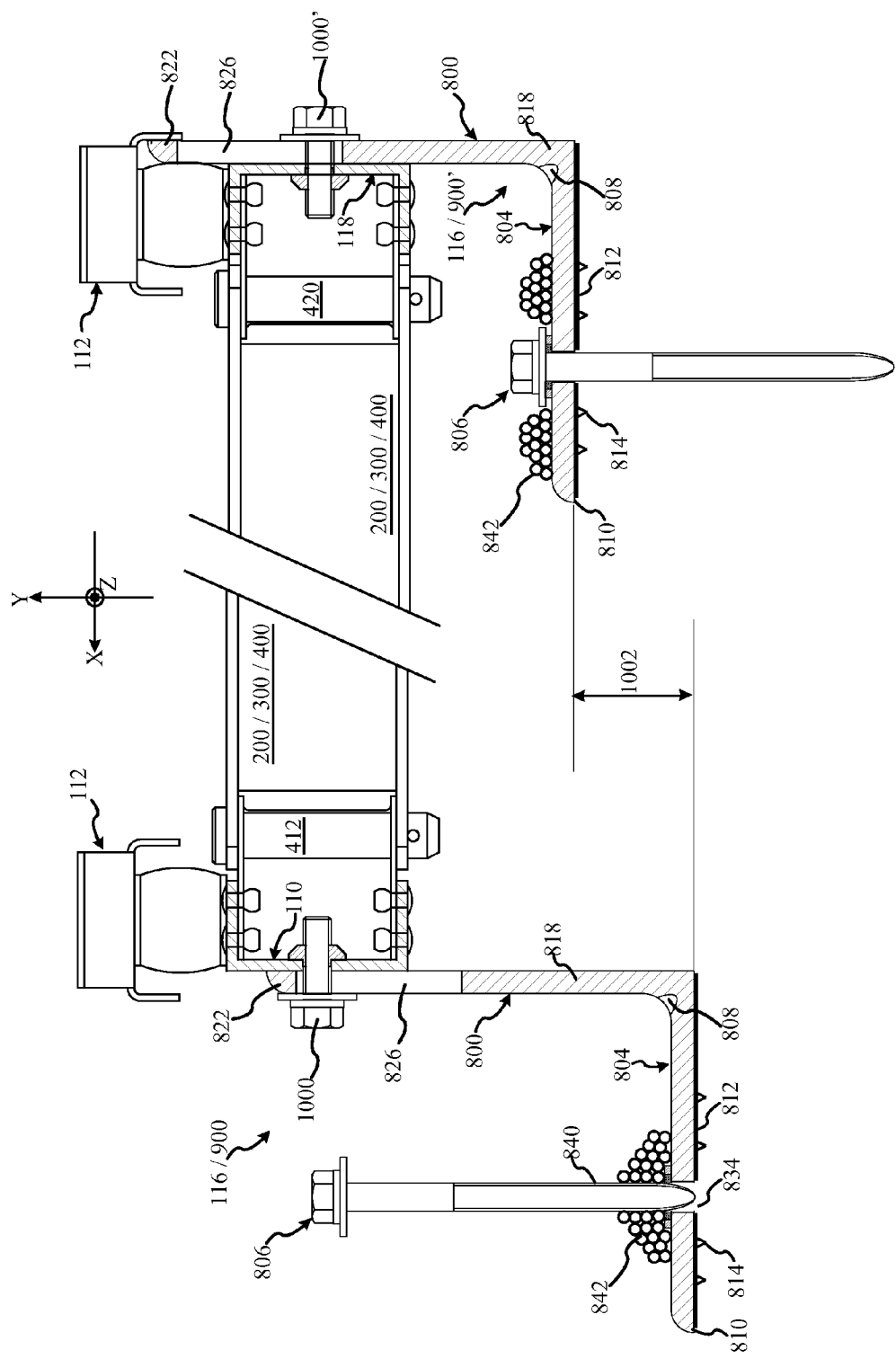

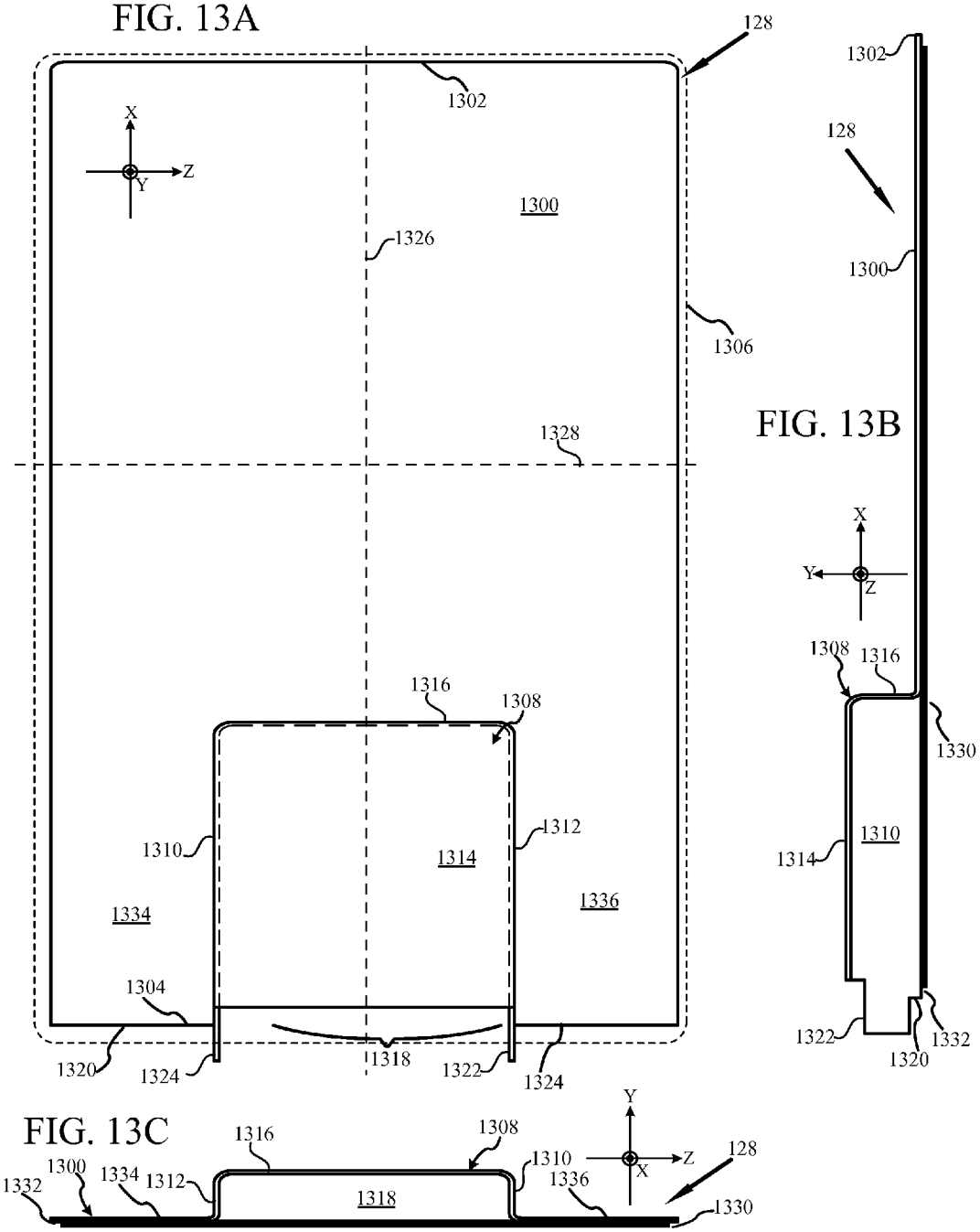

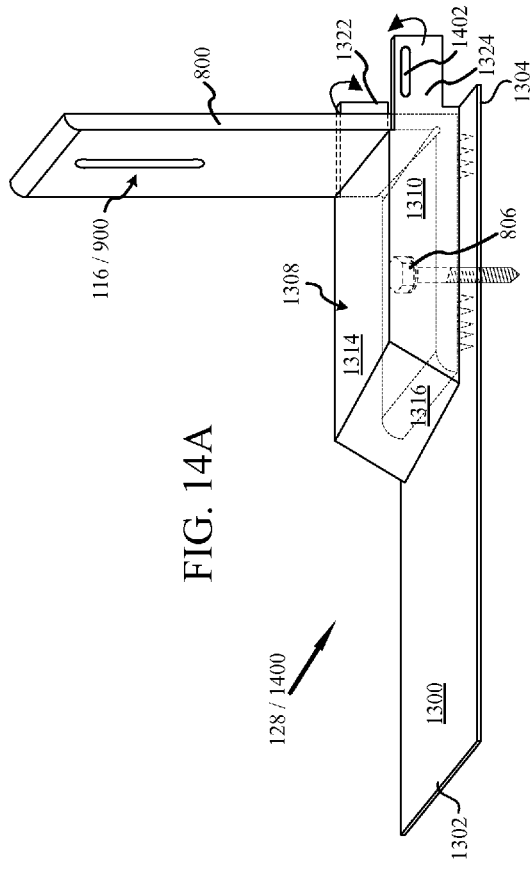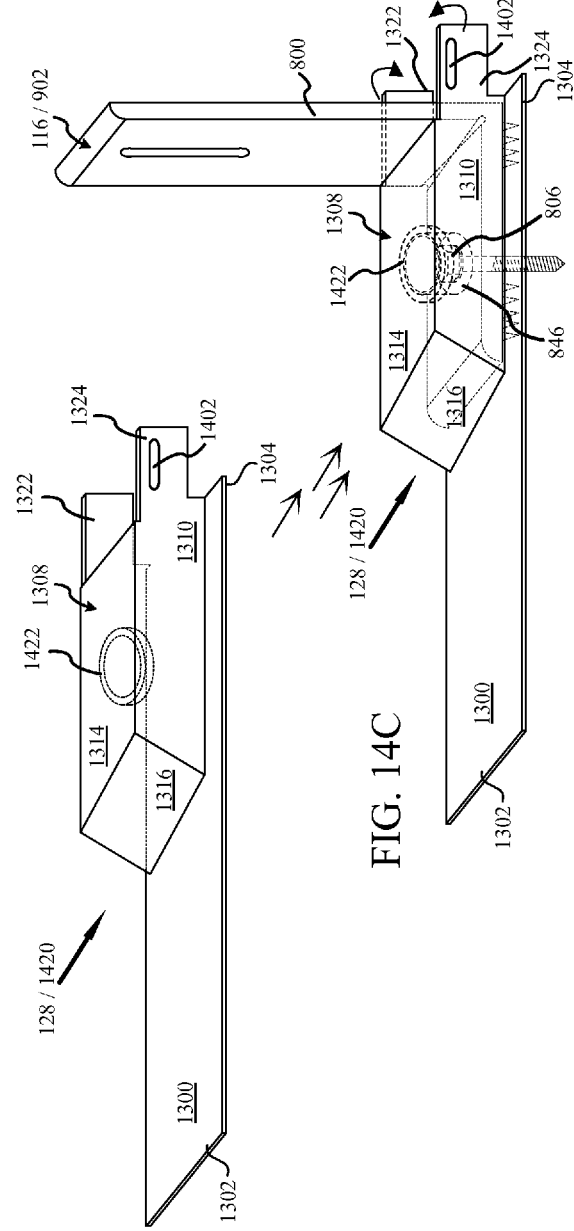
FIG. 14A
FIG. 14B
FIG. 14C

SYSTEM AND METHOD FOR ESTABLISHING A SELF-ALIGNING MOUNTING SYSTEM FOR MOUNTING PHOTOVOLTAIC MODULES

CROSS REFERENCE TO RELATED APPLICATIONS

This application claims the benefit under 35 U.S.C. §119(e) of U.S. Provisional Application No. 61/559,651 entitled SYSTEM AND METHOD FOR ESTABLISHING A SELF-ALIGNING MOUNTING SYSTEM FOR MOUNTING PHOTOVOLTAIC MODULES filed Nov. 14, 2011, the disclosure of which is incorporated herein by reference.

FIELD OF THE INVENTION

The present invention relates generally to the mounting of framed photovoltaic modules atop roofs or other structures, and more specifically to a system and method for providing a self-aligning mounting system for mounting photovoltaic modules upon rooftops or other surfaces.

BACKGROUND

With growing energy costs alternative energy sources are increasingly sought. This trend is present in both the commercial and residential environments. Solar energy has long been recognized as a possible green energy source for both the heating of water and the generation of electricity.

For energy production, photovoltaic cells grouped together as panels or modules are a common option. With commercial rooftops generally being substantially flat, installation issues are generally focused on doing minimum harm to the roof to prevent leaks, taking care not to overload or stress the roof, etc. Moreover, compared to residential homes, the flat roofs of most commercial installations are generally simple.

With the growing increase in residential photovoltaic module installation flat roofs are far less common. Indeed, for most single-family homes, the roof is pitched. While this presents a potential benefit for aligning photovoltaic modules at a beneficial angle for incidence of sunlight, it also presents additional challenges for the installation of the photovoltaic module or modules.

Not only does the mounting system serve to safeguard the photovoltaic modules from force vectors due to wind, rain, snow, hail and other element of weather, but the mounting system generally is desired to be as aesthetic and unobtrusive as possible. In general this means the mounting system fits beneath the photovoltaic modules. Although more track homes are being built as construction issues are simplified for builders, there are still enough variations that each roof is substantially unique.

Typically therefore a rack mounting system is laid out and assembled piecemeal with periodic alignment checks, chalk lines and multiple measurements made in an effort to maximize usable roof space in a safe and aesthetically pleasing manner. As the mounting system is physically anchored to the pitched roof, multiple holes are introduced to the roof during installation, and this can be an issue with respect to future weather proofing and water proofing.

Each spot selected for anchoring may or may not seat itself well against the roofing material. Further, in some installations the anchoring process may disrupt the roofing tiles or shingles such that despite whatever anchoring hole is made, the roofing material itself may be damaged and no longer weather or more specifically water proof.

In addition, as traditional mounting systems are assembled piecemeal on the spot, the installer must not only hold, position and assemble the components of the mounting system, but he or she must also hold the nuts, bolts, clamps, brackets, connectors, drill, glue and other various tools and assembly elements. As the roof is typically pitched, to drop an element is to likely see it fall to the ground—a distance that may vary from a few feet to tens of feet.

When an item is dropped, it is frequently human nature to reach for the dropping item, which on a roof can present a significant safety hazard. The lack, loss or misplacement of a single component can significantly frustrate the entire installation process, adding to labor costs and overall time.

Add to this that local weather conditions change frequently and installers may be called upon to install, repair or upgrade an installation of photovoltaic modules in a variety of conditions, including wind, rain, frost and icing and issues of a pitched roof and multiple separate elements for installation can become a safety concern.

Moreover, a typical residential photovoltaic module system installation can easily take an entire day per kilowatt, subject the installer or installers to multiple trips up to and down from the roof, require careful measuring and re-measuring, mounting and remounting, changing conditions in footing, as well as potentially damaging the weather proofing integrity of the roof itself.

Hence there is a need for a method and system that is capable of overcoming one or more of the above identified challenges.

SUMMARY

This invention solves the problems of the prior art by providing novel systems and methods for establishing a self-aligning mounting system for mounting photovoltaic modules on a surface.

In particular, and by way of example only, according to one embodiment of the present invention, provided is a self-aligning system for mounting at least one photovoltaic module to a surface, including: a plurality of rails, each rail having a plurality of slideably attached friction locking retainers, and a plurality of anchors with fasteners extending opposite from friction locking retainers; a collapsible separator coupled between the rails and structured and arranged to align the rails to each other at a pre-defined separation distance; and each friction locking retainer structured and arranged to laterally slide along a portion of each rail and remain as positioned by a user, each friction locking retainer further structured and arranged to grip and permit adjustment of at least one photovoltaic module during mounting.

In yet another embodiment, provided is a self-aligning system for mounting at least one photovoltaic module to a surface, including: a first rail having a plurality of friction locking retainers slideably attached to a first side of the first rail, and a plurality of anchors with fasteners extending opposite from the first side of the first rail; a second rail having a plurality of friction locking retainers slideably attached to a first side of the second rail, and a plurality of anchors with fasteners extending opposite from the first side of the second rail; a collapsible separator coupled between the first rail and the second rail and structured and arranged to align the first rail and the second rail to each other at a pre-defined separation distance; and each friction locking retainer structured and arranged to laterally slide along a portion of the first side of each rail and remain as positioned by a user, each friction locking retainer further structured and arranged to grip and permit adjustment of at least one photovoltaic module during mounting.

Further, in yet another embodiment provided is a self-aligning system for mounting at least one photovoltaic module to a surface, including: at least two mounting means for mounting at least one photovoltaic module; a collapsible alignment means for aligning the mounting means to one another at a pre-defined separation distance; an anchoring means for anchoring the mounting means to a surface; and a friction locking means permitting user adjustment in positioning along the mounting means and holding at least one photovoltaic module while permitting alignment of the photovoltaic module upon the mounting means.

Yet further, in another embodiment, provided is a method for mounting at least one photovoltaic module to a surface, the method including: providing a self-aligning mount having: a first rail having a plurality of friction locking retainers slideably attached to a first side of the first rail, and a plurality of anchors with fasteners extending opposite from the first side of the first rail; a second rail having a plurality of friction locking retainers slideably attached to a first side of the second rail, and a plurality of anchors with fasteners extending opposite from the first side of the second rail; a collapsible separator coupled between the first rail and the second rail and structured and arranged to align the first rail and the second rail to each other at a pre-defined separation distance; and each friction locking retainer structured and arranged to laterally slide along a portion of the first side and remain as positioned by a user, each friction locking retainer further structured and arranged to grip and permit adjustment of at least one photovoltaic module during mounting; disposing the first rail upon a roof and aligning at least one anchor of the first rail to a roof rafter and affixing the aligned anchor to the rafter by the fastener; expanding the collapsible separator to align and displace the second rail from the first rail by the pre-defined distance; selecting at least one anchor of the second rail and aligning the selected anchor to a roof rafter and affixing the aligned anchor of the second rail to the rafter by the fastener; placing a first edge of a first photovoltaic member within a first friction locking retainer of the first rail and a corresponding first friction locking retainer of the second rail; adjusting, if necessary, the alignment of the photovoltaic member; and securing the remaining anchors to rafters and securing the first friction locking retainers to bind the first edge of the first photovoltaic member.

Further still, in yet another embodiment, provided is an anchor for anchoring at least a portion of a self-aligning mounting system for photovoltaic modules to a surface including: a ridged supporter having a predetermined length structured and arranged to permit vertical height attachment and adjustment of at least a portion of a photovoltaic anchoring rack; and a base, coupled to the ridged supporter, the base structured and arranged to affix the base to a surface with a fastener, the base having an underside having a water sealing material disposed thereon and structured and arranged to form a generally waterproof seal when the base is affixed by the fastener to the surface.

For yet another embodiment, provided is an anchor for anchoring at least a portion of a self-aligning mounting system for photovoltaic modules to a surface including: a ridged supporter having a predetermined length structured and arranged to permit vertical height attachment and adjustment of at least a portion of a photovoltaic anchoring rack; and a base, coupled to the ridged supporter, the base structured and arranged to affix the base to a surface with a fastener, the base having an underside having at least one gripper structured and arranged to grip into the surface when the base is affixed by the fastener to the surface.

And yet for another embodiment, provided is an anchor for anchoring at least a portion of a self-aligning mounting system for photovoltaic modules to a surface including: a ridged supporter having a predetermined length structured and arranged to permit vertical height attachment and adjustment of at least a portion of a photovoltaic anchoring rack; and a base, coupled to and extending generally perpendicularly from the ridged supporter along a union having a weep notch disposed at least partially therein, the weep notch structured and arranged to direct water away from the anchor when the base is affixed to a surface with a fastener.

In yet another embodiment, provided is an anchor for anchoring at least a portion of a self-aligning mounting system for photovoltaic modules to a surface including: a first arm having a longitudinal axis between a first end and a second end; an elongated aperture through the first arm and about the longitudinal axis disposed proximate to the first end and extending towards the second end; a second arm extending from the second end generally perpendicularly to the first arm, the second arm having first side and a second side, and a first opening generally parallel to the first arm between the first side and the second side; and a water sealing material disposed upon the second side.

Further, in yet another embodiment, provided is a friction locking retainer for a self-aligning system of mounting at least one photovoltaic module having a thickness to a surface, including: a clamp having a central portion defined by at least one generally vertical wall having a distal end with a flange transverse to the wall and extending away from the central portion, the central portion further having a first opening; a first elastomer element disposed below the first opening opposite from the central portion, the elastomer element having a central passage aligned to the first opening; a bolt having a head section and a threaded section, the bolt disposed to pass through the first opening and the central passage of the elastomer element; and a nut disposed about the threaded section of the bolt extending from the central passage.

And further, in another embodiment, provided is a friction locking retainer for a self-aligning system of mounting at least one photovoltaic module having a thickness to a surface, including: a clamp having a central portion defined by a generally annular generally vertical wall having a distal end with a generally circular flange transverse to the annular wall and extending away from the central portion, the central portion further having a first opening; a first elastomer element disposed below the first opening opposite from the central portion, the elastomer element having a central passage aligned to the first; a bolt having a head section and a threaded section, the bolt disposed to pass through the first opening and the central passage of the elastomer element; and a nut disposed about the threaded section of the bolt extending from the central passage.

Further still, in another embodiment, provided is a friction locking retainer for a self-aligning system of mounting at least one photovoltaic module having a thickness to a surface, including: a gripper structured and arranged to grip at least a portion of a photovoltaic module; a compressible positioner structured and arranged to position the gripper at a predetermined height to receive a photovoltaic module; and an attacher structured and arranged to hold the gripper and positioner and permit friction locking of the positioner in an elongated aperture of a rail for mounting photovoltaic modules.

Further still, in yet another embodiment, provided is a removable water cap to cap a fastener retaining a self-aligning system of mounting photovoltaic modules to a surface, including: a base having a first end structured and arranged to fit between at least two roof shingles; and a second end opposite from the first end, the second end structured and arranged to receive and generally seal the fastener, and permit an undersurface of the base to be generally in consistent contact with at least one underlying shingle.

Yet still, in another embodiment, provided is a removable water cap to cap a fastener retaining a self-aligning system of mounting photovoltaic modules to a surface, including: a base having a first end and opposite thereto a second end, the base generally defining a plane; the first end structured and arranged to fit between at least two roof shingles; and the second end structured and arranged to provide an enclosure having generally two sides, a top and front formed in the second end and rising above the plane, the enclosure having an opening opposite from the front and disposed proximate a distal end of the second end and at least one bendable tab generally normal to the first plane and extending away from the opening.

And further, in yet another embodiment, provided is a removable water cap to cap a fastener retaining a self-aligning system of mounting photovoltaic modules to a surface, including: a means for binding between at least two roof shingles; an enclosing means for enclosing at least part of a fastener; an attaching means for removably attaching the removable water cap to an anchor secured by the fastener; and a water redirecting means for directing water away from the enclosing means.

BRIEF DESCRIPTION OF THE DRAWINGS

At least one method and system for establishing a self-aligning mounting system for mounting photovoltaic modules on a surface will be described, by way of example in the detailed description below with particular reference to the accompanying drawings, and:

FIGS. 2A-2C are top views illustrating the operation of the collapsible separators of the self-aligning mounting system for photovoltaic modules according to at least one embodiment of the present invention;

FIGS. 6A-6C present end, top and side views of a rail of the self-aligning mounting system for photovoltaic modules according to at least one embodiment of the present invention;

FIG. 9 presents a series of perspective views of varying embodiments of an anchor for anchoring at least a portion of a self-aligning mounting system for photovoltaic modules to a surface according to varying embodiments of the present invention;

FIG. 10 is a side cut through view of anchors mounted to a self-aligning mounting system for photovoltaic modules further demonstrating vertical height adjustment according to at least one embodiment of the present invention;

FIGS. 13A-13C shows a removable water cap to cap a fastener for retaining a self-aligning mounting system for photovoltaic modules to a surface according to at least one embodiment of the present invention;

FIGS. 14A-14C are perspective illustrations of removable water caps to cap a fastener for retaining a self-aligning mounting system for photovoltaic modules to a surface according to varying embodiments of the present invention;

DETAILED DESCRIPTION

Before proceeding with the detailed description, it is to be appreciated that the present teaching is by way of example only, not by limitation. The concepts herein are not limited to use or application with a specific system or method for a self-aligning mounting system for mounting photovoltaic modules. Thus although the instrumentalities described herein are for the convenience of explanation shown and described with respect to exemplary embodiments, it will be understood and appreciated that the principles herein may be applied equally in other types of systems and methods involving installing and/or mounting photovoltaic modules.

Figure 1:
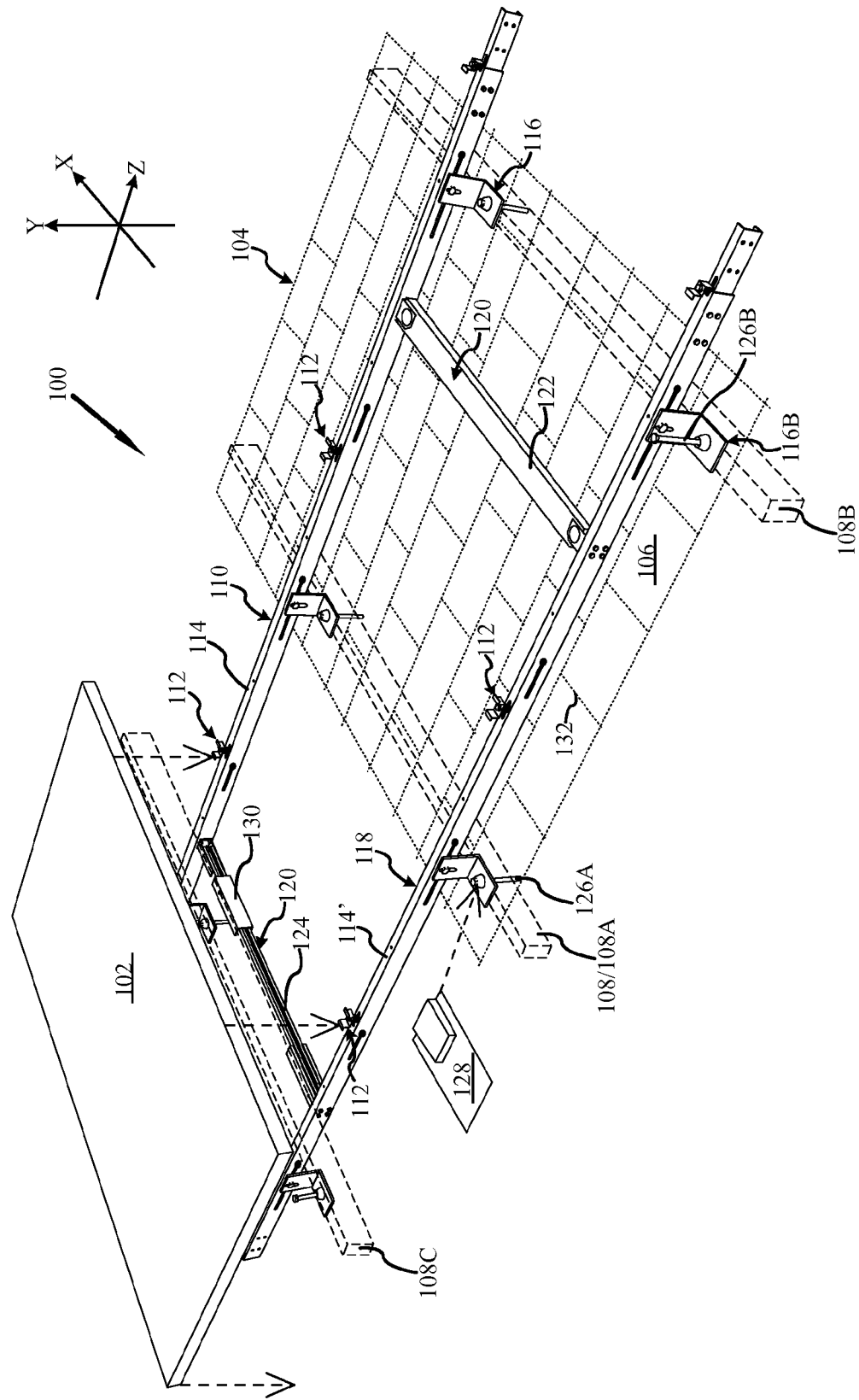
FIG. 1 is a perspective view illustrating a self-aligning mounting system for photovoltaic modules according to at least one embodiment of the present invention.

Turning now to the drawings, and more specifically FIG. 1, there is shown a conceptual illustration of the Self-Aligning Mounting System ("SAMS") 100 or Racking System as it may also be known, in accordance with certain embodiments. As is further described in the description below, the SAMS 100 advantageously permits mounting of at least one photovoltaic panel or module 102 to a surface 104, such as a roof.

To facilitate the description of SAMS 100, the orientations of SAMS 100 and associated components as presented in the figures are referenced to the coordinate system with three axis orthogonal to one another as shown in FIG. 1. These axis intersect mutually at the origin of the of the coordinate system, which is chosen to be the center of SAMS 100, however the axis shown in all figures are offset from SAMS 100, and/or the components thereof for ease and clarity of illustration. In addition, as some illustrations show SAMS 100 and/ or elements thereof in relation to a surface 104 such as a roof and some do not, the coordinate axes may be reset from figure to figure so as to be most beneficial in understanding each figure as shown. Moreover, FIG. 1 is a perspective view of SAMS 100 in accordance with the X, Y and Z axis as shown. For the sake of ease of illustration and discussion, FIG. 1 is presented such that SAMS 100 is viewed as it would be seen looking down from the peak of the roof.

As embodiments of the SAMS are likely to be used for mounting PV Modules 102 to commercial and residential roofs, in general SAMS 100 is therefore intended to be mounted upon shingles 106, such as asphalt, composite, tile, or other shingle material, which in turn are supported by regularly spaced supports, such as wood rafters 108, of which rafters 108A-108C are exemplary, previously provided at regular standard spacing such as 12" on center, 16" on center, or 24" on center.

For at least one embodiment, SAMS 100 is provided with substantially all mounting hardware being pre-positioned, or at least prepared for pre-positioning before being mounted upon a surface 104. Further, for at least one embodiment, all mounting hardware is pre-established for a 7/16 "hex" socket. For at least one alternative embodiment, a proprietary socket may be employed to reduce the chance of theft of system components.

Commonality of mounting hardware also reduced the need for an installer to change drive heads—eliminating yet another opportunity for drop. As such, the installing party is freed from the need of on roof assembly of small parts and components. By removing this element from the assembly process, the chance for dropping or the loss of small components and parts, risk to the installer and the likelihood of repeated trips to and from the roof location are greatly minimized.

As shown, SAMS 100 generally includes a plurality of rails, and more specifically, at least a first rail 110 having a plurality of friction locking retainers 112 attached to a first side 114 of the first rail 110, and a plurality of anchors 116 extending opposite from the first side 114. SAMS 100 also includes a second rail 118, and in at least one embodiment, the second rail 118 is substantially the same as the first rail 110. Moreover the second rail 118 has a plurality of friction locking retainers 112 attached to a first side 114', and a plurality of anchors 116 extending opposite from the first side 114'.

SAMS 100 further includes a collapsible separator 120 coupled between the first rail 110 and the second rail 118 and structured and arranged to align the first rail 110 and the second rail 118 to each other at a pre-defined separation distance. In varying embodiments, and as is further described below, the collapsible separator 120 may be provided by one or more cross bars, telescoping rods/cross bars, cables of predefined length, a scissoring body or other appropriate device that may be adapted to space apart and align the first and second rails 110, 118. For at least one embodiment, the collapsible separator 120 is provided by at least two crossbars, specifically cross bar 122 and cross bar 124 as further described below.

As is shown in FIG. 1, in general each anchor 116 is disposed above a rafter 108, such as exemplary rafters 108A 108B and 108C and fastened to that rafter by a fastener 126. In addition, SAMS 100 may also include a plurality of removable water caps, of which removable water cap 128 is exemplary. Removable water cap 128 as described below is structured and arranged to cap at least a portion of anchor 116 and thereby reduce the opportunity for water to reach the fastener 126 of anchor 116. Fastener 126A is shown deployed into rafter 108A and is therefore ready to receive removable water cap 128. Fastener 126B is shown in its initial state, ready to be deployed into rafter 108B.

The components of SAMS 100 are typically constructed from weather durable materials, such as but not limited to aluminum, stainless steel, galvanized steel, copper, brass, plastic, polycarbonate and other such materials. Indeed for at least one embodiment the primary components of SAMS 100, e.g., the first rail 110 and the second rail 118 are electrically conductive and therefore suitable for grounding the photovoltaic modules 102 as well as the overall SAMS 100 installation.

Moreover, to summarize, for at least one embodiment SAMS 100 generally includes a plurality of rails (e.g., rails 110, 118), each having a plurality of slideably attached friction locking retainers 112, and a plurality of anchors 116 with fasteners extending opposite from friction locking retainers 112. A collapsible separator 120 is coupled between the rails and structured and arranged to rails to each other at a pre-defined separation distance; and each friction locking retainer 112 is structured and arranged to laterally slide along a portion of each rail and remain as positioned by a user. Each friction locking retainer 112 is further structured and arranged to grip and permit adjustment of at least one photovoltaic module 102 during mounting.

Rails and Crossbars

For at least one embodiment, the collapsible separator 120 is provided by one or more cross bars of which cross bars 122 and 124 are exemplary. Although in certain embodiments, the cross bars may be entirely removable, to reduce installation time, facilitate consistency of installations, and/or other purposes, for at least one embodiment the cross bars 122, 124 are structured and arranged to rotate between a first position of being generally parallel to the first and second rails 110, 118 (the collapsed position) and a second position of being generally normal to the first and second rails 110, 118 (the aligning position).

Moreover, as shown in FIGS. 2A-2C, for at least one embodiment, the cross bars 200, 202 are pre-attached to both the first rail 110 and the second rail 118 such that in either the collapsed or aligned position the first rail 110 and the second rail 118 are interconnected. As shown in FIG. 2, representing the aligned position, SAMS 100 has an overall length 204 and an overall width 206, such that in the aligned position SAMS 100 occupies a first amount of space 208 as shown generally by dotted rectangle.

For the embodiment of SAMS 100 shown in FIGS. 2A-2C the cross bars 200, 202 providing the collapsible separator 120 are structured and arranged to scissor, or fold. This functional ability is achieved as each cross bar 200, 202 has a rotating hinge 210 at midpoint, and first rotating joints 212 at first ends 214 connecting cross bars 200, 202 to the first rail 110 and second rotating joints 216 at second ends 218 connecting cross bars 200, 202 to the second rail 118. FIG. 2B further shows cross bars 200, 202 in a partially collapsed state.

When the cross bars 200, 202 are in the collapsed position, SAMS 100 has generally the same overall length 204, but a vastly reduced width 220, such that in the collapsed position SAMS 100 occupies a second amount of space 222, shown generally by dotted rectangle that is significantly less than the first amount of space 208 by several orders of magnitude.

As FIG. 2C represents an embodiment of SAMS 100 in a pre-install state, such as but not limited to storage, shipping, transport by operator to the installation site, it is clear by comparison of FIG. 2A to FIG. 2C that the collapsed state of SAMS 100 provides an advantageous conservation of space.

In addition, FIG. 2A further illustrates braces 224, 226 which may be used in at least one embodiment to lock cross bars 200, 202 in place in their aligning position. As shown, brace 224 has a rotating point of attachment 228 at a first end 230 to cross bar 202 and a pin 232 at a second 234 end structured and arranged to engage a hole in second rail 118. Brace 226 is shown deployed.

Of course it is understood and appreciated that in varying embodiments the rotating point of attachment 228 may be on the second rail 118 and second end 234 may provide a hole to receive a pin provided by cross bar 202. Further, although braces 224 and 226 are shown between cross bars 200 and 202 and second rail 118, in varying embodiments braces may be between cross bars 202 and 202 and first rail 110.

Figure 3A:
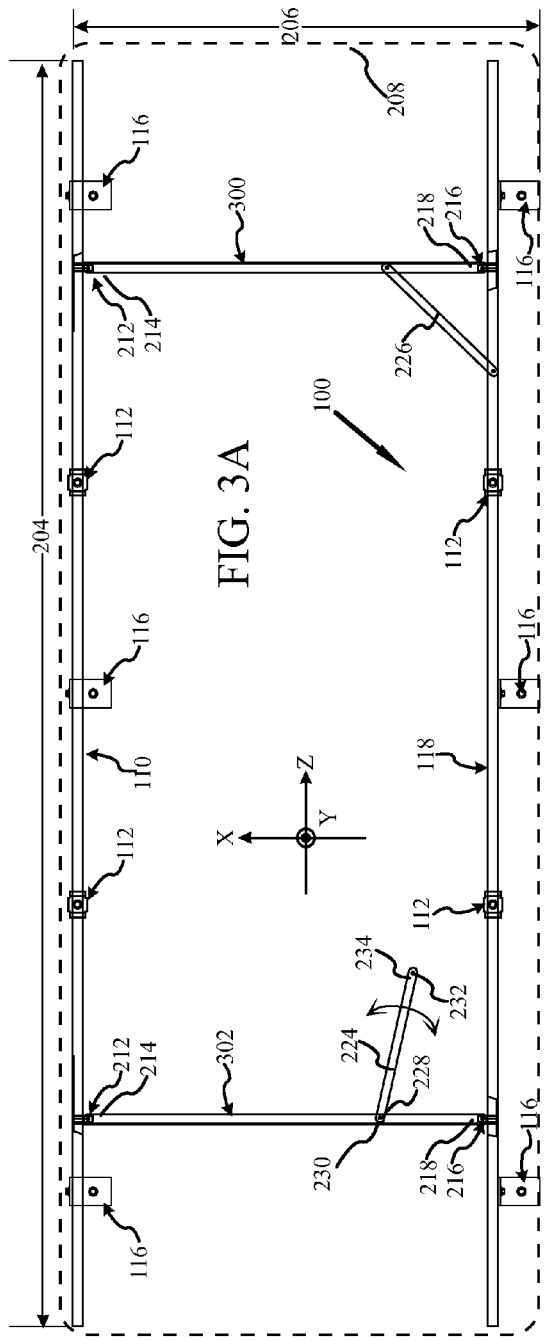
FIGS. 3A-3B are top views illustrating the operation of the collapsible separators of the self-aligning mounting system for photovoltaic modules according to at least another embodiment of the present invention.
Figure 3B:
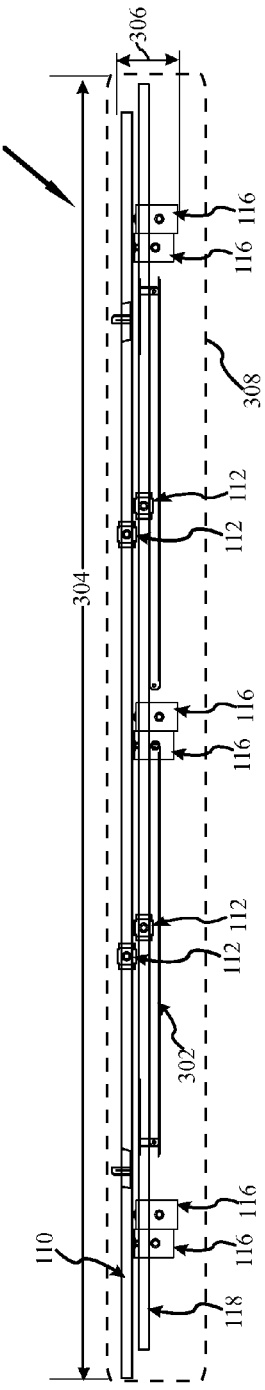

FIGS. 3A and 3B illustrate yet another embodiment wherein the cross bars 300, 302 are disengaged from at least one rail when in the collapsed position. Moreover, for the embodiment shown, the cross bars 300 and 302 are attached to the first rail 110 with rotating joints 212 at first ends 214 and attached to the second rail 118 with rotating joints 216 at second ends 218.

In this embodiment, the rotating joints 216 at the second ends 218 can be disengaged from the second rail 118. Indeed, because these joints can be disengaged, for at least one alternative embodiment, it may be immaterial as to whether joints 216 permit rotation. Moreover, to simplify manufacturing purposes joints 212 and 216 may be substantially identical or they may be different.

As in FIG. 2A, when the cross bars 300, 302 are in their alignment position as shown in FIG. 3A, SAMS 100 has an overall length 204 and an overall width 206 generally defining the first amount of space 208. In the collapsed position as shown in FIG. 3B, SAMS 100 has an overall length 304 and an overall width 306 generally defining second space 308 which again is clearly orders of magnitude less than the first space 208.

Figure 4A:
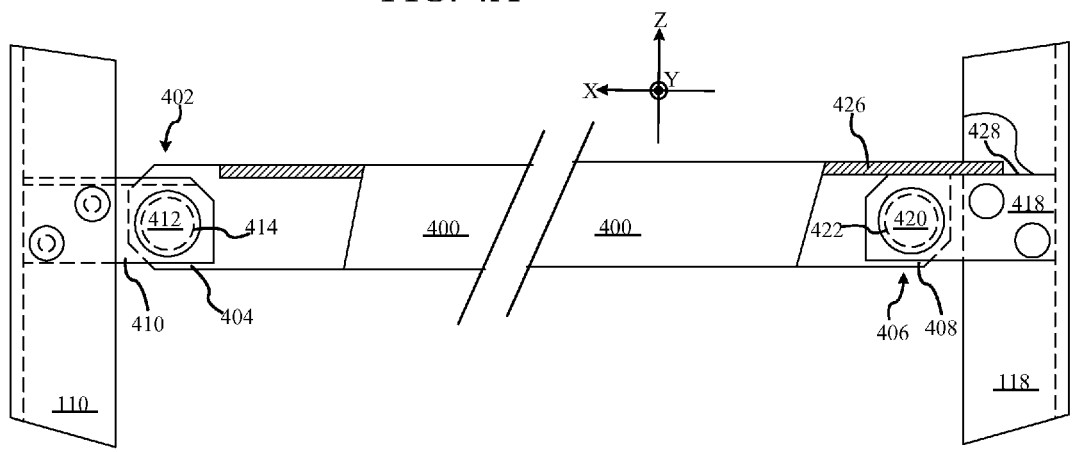
FIGS. 4A-4B presents top and side views of a collapsible separator of the self-aligning mounting system for photovoltaic modules according to at least one embodiment of the present invention.
Figure 4B:
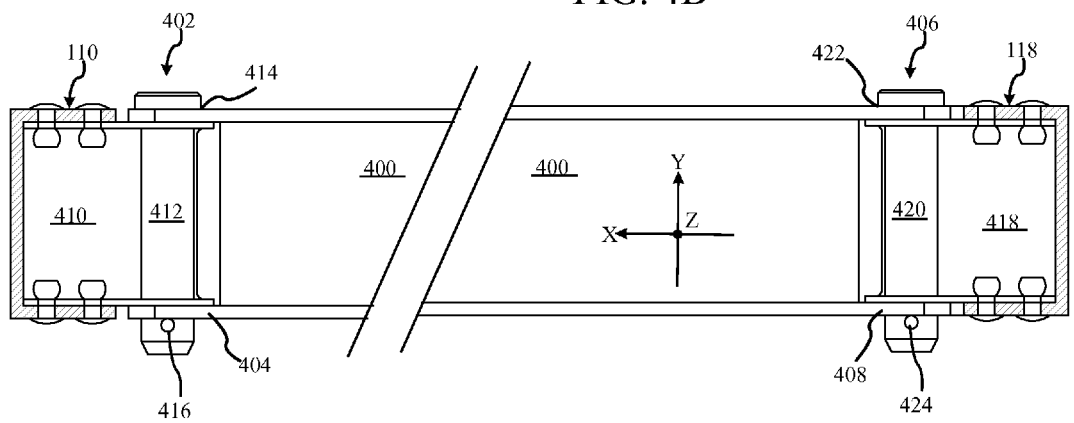

FIG. 4A providing a top view and FIG. 4B providing a corresponding side view, provide an enlarged detail of cross bar 400 and specifically the rotating connection point 402 between a first end 404 of cross bar 400 and the first rail 110 and the rotating connection point 406 between a second end 408 of cross bar 400 and second rail 118. In varying embodiments, cross bar 400 may be cross bar 122 shown in FIG. 1, cross bar 200 as shown in FIGS. 2A-2C or cross bar 300 as shown in FIGS. 3A-3B.

As shown in FIGS. 4A and 4B the first rail 110 provides a mount 410 rigidly coupled to first rail 110 in vertical alignment and set to receive a joining pin 412 passing vertically through the mount 410 and corresponding apertures 414 in the first end 404 of cross bar 400. When joining pin 412 is installed, button spring 416, shown in FIG. 4B, serves to lock joining pin 412 in place. It is understood and appreciated that the mount 410, joining pin 412 and apertures 414 are structured and arranged to permit rotation of cross bar 400 in a horizontal plane with minimal vertical deflection.

Similarly second rail 118 provides a mount 418 rigidly coupled to the second rail 118 in vertical alignment and set to receive a joining pin 420 passing vertically through the mount 418 and corresponding apertures 422 in the second end 408 of cross bar 400. When joining pin 420 is installed, button spring 424 serves to lock joining pin 420 in place. It is understood and appreciated that the mount 418, joining pin 420 and apertures 422 are structured and arranged to permit rotation of cross bar 400 in a horizontal plane with minimal vertical deflection.

The second end 408 of cross bar 400 has a rotation stopper 426 which is structured and arranged to prevent further rotation when cross bar 400 is perpendicular to the second rail 118. For at least one embodiment, the rotation stopper 426 is a metal plate joined to the second end 408 of the cross bar 400 which will engage the metal side 428 of mount 418. Rotation stopper 426 may be used in addition to, or in place of braces 224, 226 as shown and described above.

Cross bar 124 as shown in FIG. 1, cross bar 202 as shown in FIGS. 2A-2C or cross bar 302 as shown in FIGS. 3A-3B may be similarly provided by implementing or reversing the configuration of elements described with respect to cross bar 400. In addition, although the cross bars have been shown and described as being generally normal to the rails when in their aligning position, other orientations may be adopted and are within the scope of this teaching.

Returning to FIG. 1, for at least one embodiment, each cross bar 122, 124 has a locking mechanism, such as the slider 130 of cross bar 124, or spring pins (not visible in FIG. 1) of cross bar 122 which is structured and arranged to lock each cross bar in a predefined orientation to establish the predefined distance of separation and alignment between the first and second rails 110, 118.

Moreover, when collapsible separator 120 is deployed, the first rail 110 and second rail 118 are properly aligned to one another for support and anchoring of one or more photovoltaic panels 102 as is further described below. In addition, for at least one embodiment, once the rails have been aligned and anchored the collapsible separator 120 is removed and recycled in another SAMS 100.

As is further described below, each friction locking retainer 112 is structured and arranged to laterally slide along a portion of the first side 114, 114' of each rail 110, 118 and remain as positioned by a user. Each friction locking retainer 112 is further structured and arranged to grip and permit adjustment of at least one photovoltaic module 102 during mounting.

In addition, each anchor 116 is structured and arranged to laterally slide along at least a portion of each rail 110, 118 and provide independent and adjustable vertical alignment so as to accommodate variation of elevation as may be encountered with surface 104.

FIGS. 5A-5D further illustrate how such lateral adjustment is permitted at least in part by either the first rail 110 or the second rail 118, in accordance with at least one embodiment. More specifically, as shown for at least one embodiment, the first or second rail 110, 118 is formed from a "C" channel rail 500, as shown by the cross section view of FIG. 5A. For at least one alternative embodiment, the first or second rail 110, 118 is formed from an "L" rail, not shown. A plurality of slots 502 are established at pre-determined intervals in the first side 114, i.e. top surface, shown in FIG. 5B.

In at least one embodiment, these slots 502 are provided with at least one large nut receiving aperture 504 that is integrally coupled to a nut retaining aperture 506. A nut binder 508, such as but not limited to a metal rail or ridge is established adjacent to the nut retaining aperture 506 so that a square nut may slide laterally adjacent to the nut retaining aperture 506, but not rotate. In other words when a bolt to which the nut is attached is rotated, the nut binder 508 prevents rotation and thus allows the bolt to be tightened or loosened against the nut.

As such, the friction locking retainer 112, further described below, is permitted lateral adjustment 510. For at least one embodiment the nut receiving aperture 504 is about 0.625"

square and the nut retaining aperture 506 is about 0.343" in width and about 1.375" in length thereby collectively providing about 2" of lateral adjustment 510.

Figure 5B:
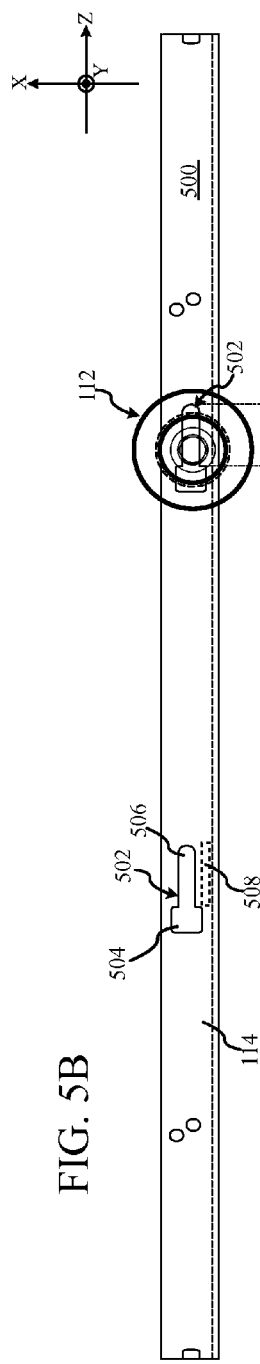
FIGS. 5A-5D presents top, side, bottom and end views of a rail of the self-aligning mounting system for photovoltaic modules according to at least one embodiment of the present invention.
Figure 5C:
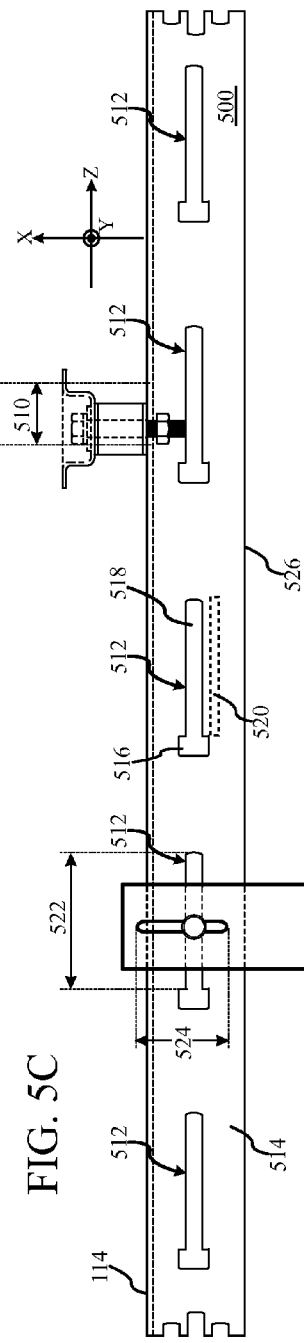
Figure 5A:
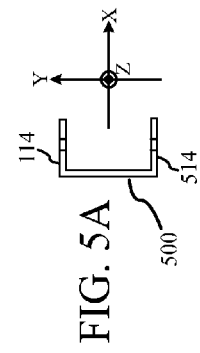

A plurality of slots 512 are also provided in the second surface 514, i.e., side surface, of rail 500, shown in FIG. 5C. These slots are provided with at least one large nut receiving aperture 516 that is integrally coupled to a nut retaining aperture 518. A nut binder 520, such as but not limited to a metal rail or ridge is established adjacent to the nut retaining aperture 518 so that a square nut may slide laterally adjacent to the nut retaining aperture 518, but not rotate. In other words when a bolt to which the nut is attached is rotated, the nut binder 520 prevents rotation and thus allows the bolt to be tightened or loosened against the nut.

As such, the anchor 116, further described below, is permitted lateral adjustment 522. For at least one embodiment the nut receiving aperture 516 is about 0.625" square and the nut retaining aperture 518 is about 0.343" in width and about 7.875" in length thereby collectively providing about 8.5" of lateral adjustment 522 for each anchor 116. In addition, it should also be appreciated, especially with respect to FIG. 5C, that rail 500 permits vertical adjustment 524 of each anchor 116.

Figure 5D:
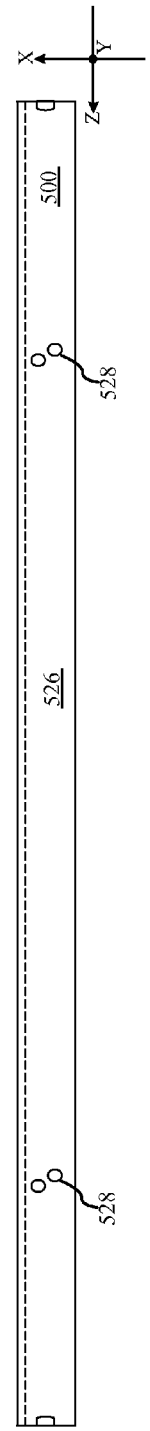

As shown in FIG. 5D the bottom 526 of rail 500 is shown to have holes 528 for the mounts to receive the cross bars as discussed above. The ends of rail 500 may be structured and arranged as shown to facilitate the coupling of one rail 500 to another, such that multiple SAMS 100 may be coupled together.

For yet another embodiment, the nut retaining aperture 506 as shown in FIG. 5C may be positioned so that an appropriately sized nut will bind against the bottom 526 without need for additional binder 520.

In addition, as roof rafters are typically provided at regular standard spacing such as 12" on center, 16" on center, or 24" on center, slots 512 are provided at interval spacing, e.g., 48", such that with a sufficient amount of lateral adjustment, i.e., an embodiment of about 4" or an embodiment of about 8", rails 500 may be fabricated in advance with a high degree of likelihood that general standard spacing options can be easily accommodated, as well as typical variations in the general spacing as are known to occur with typical construction techniques.

For yet another embodiment, lateral adjustment of one or more friction locking retainers 112 one or more anchors 116 along the first rail 119 or the second rail 118 is achieved by using a channeled rail 600 as shown in FIG. 6A-6C. Moreover rail 600 has a channel 602 disposed in the first side 114 along the entire length of the rail 600.

As shown in FIG. 6A, this channel 602 is structured and arranged to receive and retain the nut 1126 of at least one friction locking retainer 112. More specifically, for at least one embodiment, channel 602 is has a depth 604 sufficient to accommodate both the nut 1126 and a portion of the threaded section 1124 of the friction locking retainer 112 as discussed below.

As channel 602 runs the length of rail 600, one or more friction locking retainers 112 slideably disposed in connection with channel 602 are permitted generally unlimited lateral adjustment 606 along the first side 114, save of course for the friction locking retainers 112 contacting each other.

Rail 600 has at least one additional channel 608 provided generally normal to channel 602. As shown, for at least one embodiment channel 608 is disposed in the second side 610, which is generally normal to the first side 114. Channel 606 is structured and arranged to accept a slideable fastener for at least one anchor 116.

As channel 608 runs the length of rail 600, one or more anchors 116 slideably disposed in connection with the channel 608 are permitted generally unlimited lateral adjustment 612 along the second side 610, save of course for the anchors 116 contacting each other. As rafters 108 or other support structured below the mounting surface 104 are generally the targets for anchors 116, the generally unrestrained lateral adjustment 610 permitted by channeled rail 600 may be advantageous in situations where the spacing of rafters 108 is not as regular as otherwise desired.

With respect to rail 600 and specifically as shown in FIG. 6B, it is also understood and appreciated that rail 600 permits vertical adjustment 614 of one or more anchors 116 relative to the rail 600, and more specifically the second side 610.

As noted above, as roof rafters are typically provided at regular standard spacing such as 12" on center, 16" on center, or 24" on center, for at least one embodiment, rail 600 provides indicator marks, not shown, to assist an installer in generally pre-placing the anchors 116 with respect to channel 606.

For at least one embedment, rail 600 is generally symmetrical, providing channels 608 and 608' on either side. Further Rail 600 may also provide a symmetrical channel 602' on the bottom, shown in dotted relief. Moreover, for at least one embodiment, rail 600 is generally "H" shaped. Moreover, for at least one embodiment, rail 600 provides symmetrical channels with respect to the top/bottom and side/side, the rail being a generally solid structure without intentionally enclosed hollow spaces.

In addition, for at least one embodiment, channel 602 is structured and arranged for a head section 1122 of a bolt 1120 shown in FIGS. 11 and 12 such that the orientation of the bolt 1120, head section 1122 and nut 1126 is reversed.

Figure 7:
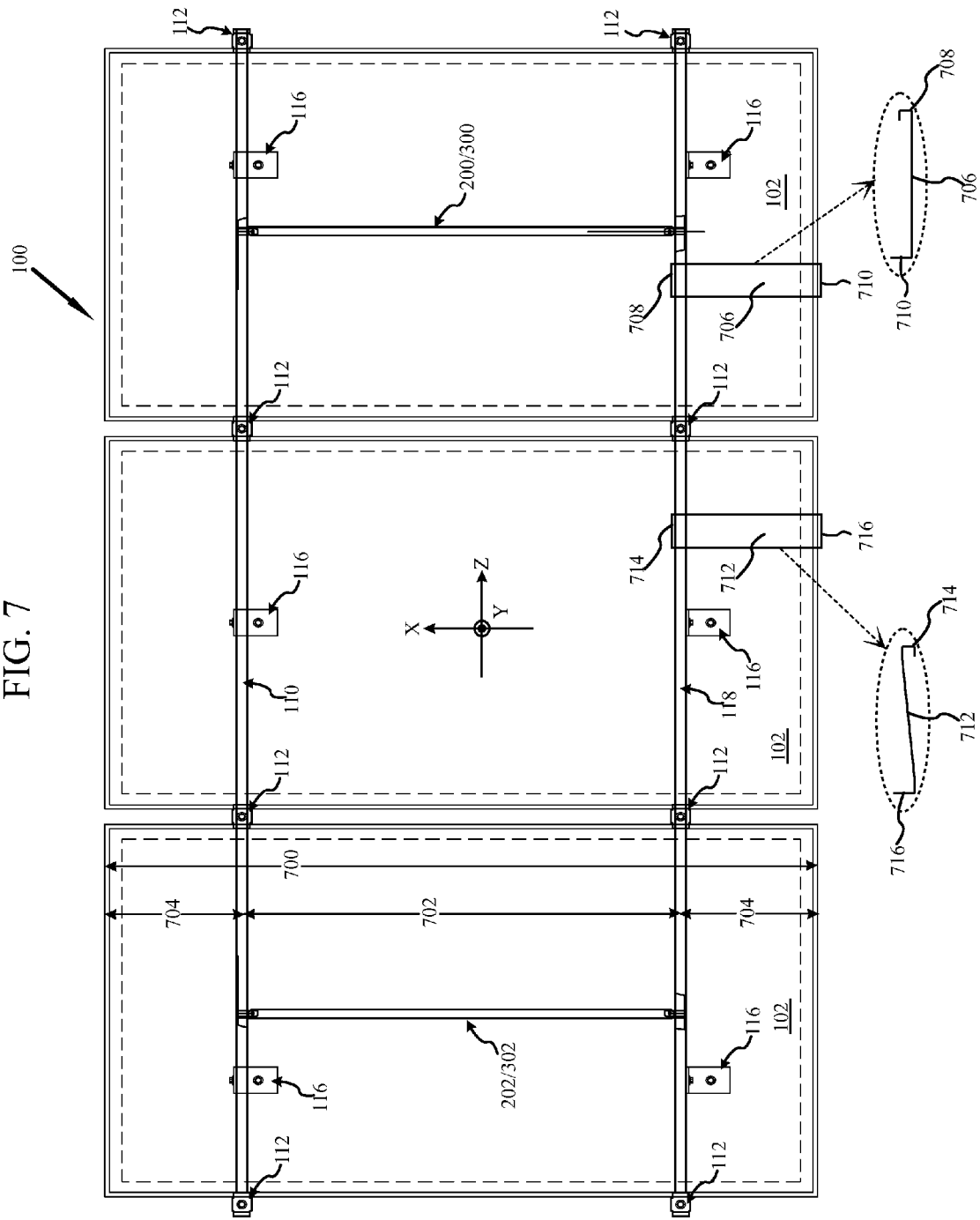
FIG. 7 is a top illustration of the self-aligning mounting system with photovoltaic modules mounted thereon according to at least one embodiment of the present invention.
Figure 8A:
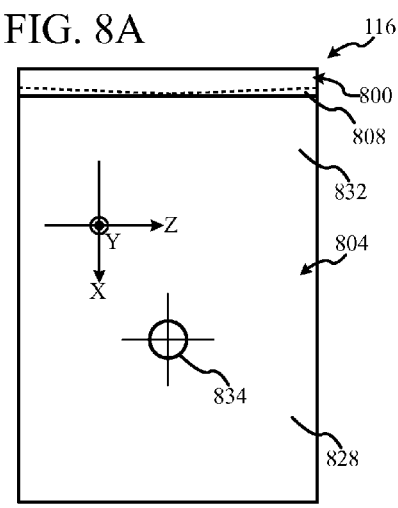
FIGS. 8A-8D presents top, bottom, front and side illustrations of an anchor for anchoring at least a portion of a self-aligning mounting system for photovoltaic modules to a surface according to at least one embodiment of the present invention.
Figure 8B:
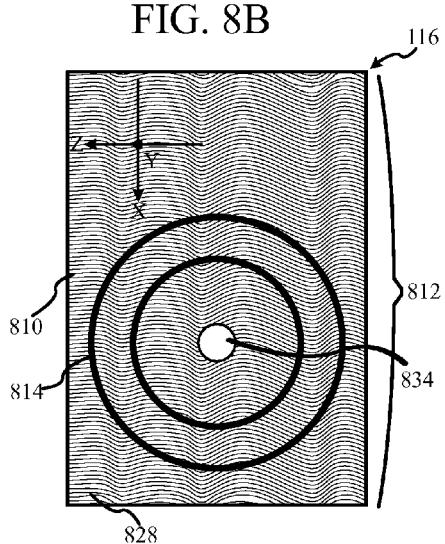
Figure 8C:
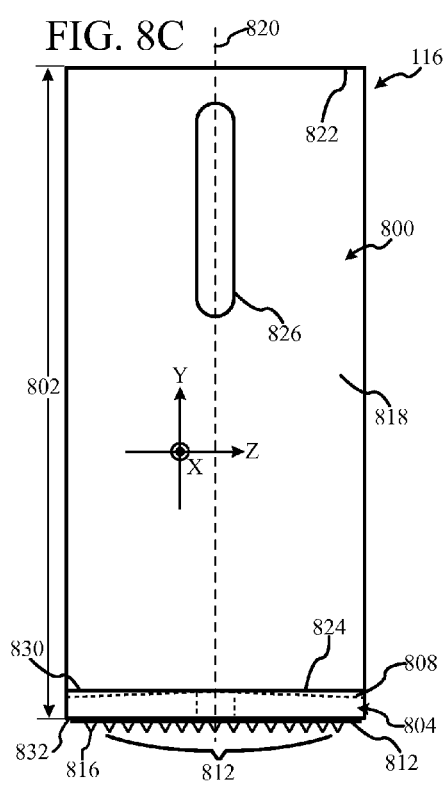
Figure 8D:
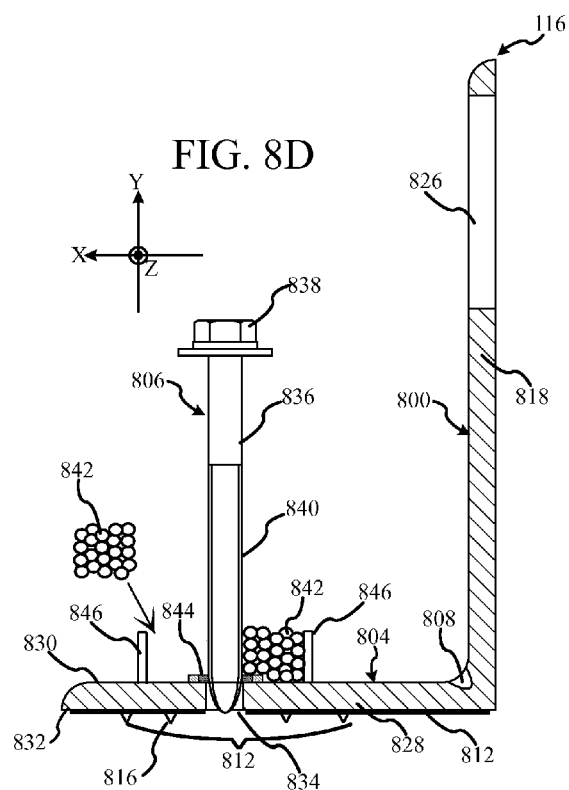

FIG. 7 illustrates at least one embodiment of SAMS 100 structured and arranged to receive three photovoltaic modules 102. As shown, each photovoltaic module 102 has a length 700, of this length 700, the center section 702 of the photovoltaic module 102 occupies about 60% of the length 700, with the distal ends 704 each being about 20% of the length 700. For strength and stability, as well as perhaps local building codes, it is generally desirable for the first rail 110 and the second rail 118 to be positioned beneath the distal ends 704.

Moreover, SAMS 100 self-aligns when the collapsible separators are deployed to ensure that the first and second rails 110, 118 are separated by a distance of at least the center section 702.

As different manufacturers provide photovoltaic modules 102 having different lengths, the distance for separation of the rails can and does change in accordance with which photovoltaic modules 102 are being used. For at least one embodiment, the collapsible separator 120 provides multiple stops to permit the installer to select the separation distance appropriate for the photovoltaic modules 102 being installed. More specifically, for at least one embodiment the cross bars are telescoping elements.

In varying embodiments, not shown, SAMS 100 is provided for the mounting of one (1) photovoltaic panel 102, the mounting of two (2) photovoltaic panels 102, and the mounting of four (4) photovoltaic panels 102. Moreover, various configuration of SAMS 100 may be combined, such as a SAMS 100 for three (3) photovoltaic panels 102 and a SAMS 100 for two (2) photovoltaic panels 102, to accommodate variations in different installation environments.

Various configurations of SAMS 100 may also be used individually so as to accommodate variations in different installation environments. In other words, SAMS 100 may be configured for various numbers of photovoltaic panels 102 and may be used attached to one another or installed separately.

As is also shown in FIG. 7, for at least one embodiment, generally proper placement of each photovoltaic module 102 upon the SAMS 100 is advantageously facilitated with the use of a placer 706.

For at least one embodiment, placer 706 is a "G" shaped band of metal. Specifically, placer 706 is structured and arranged to grasp the second rail 118 with a first end 708, and provide a catch at the second end 710 to receive and temporarily hold a photovoltaic module 102 as it is moved into position upon the SAMS 100 by an installer. Moreover, placer 706 has a pre-determined length so as to endure that the distal ends 704 of photovoltaic module 102 are properly aligned to the first rail 110 and second rail 118.

For yet another embodiment, placer 712 is an "S" shaped band of metal. Specifically, placer 712 is structured and arranged to grasp the second rail 118 with a first end 714, pass over the top of the second rail 118 to increase leverage, and provide a catch at the second end 712 to receive and temporarily hold a photovoltaic module 102 as it is moved into position upon the SAMS 100 by an Installer. Moreover, placer 712 has a pre-determined length so as to endure that the distal ends 704 of photovoltaic module 102 are properly aligned to the first rail 110 and second rail 118.

Anchor

As noted above, SAMS 100 is attached to a surface 104 such as a roof with the use of a plurality of anchors 116. FIGS. 8-10 illustrate at least one anchor 116 for anchoring at least a portion of SAMS 100 to a surface. More specifically, in accordance with at least one embodiment, FIGS. 8A-8D presents a series of views—FIG. 8A a top view, FIG. 8B a bottom view, FIG. 8C a front view and FIG. 8D a side cut through view of an anchor 116.

Anchor 116 has a ridged supporter 800 having a predetermined length 802 that is structured and arranged to permit vertical height adjustment of at least a portion of SAMS 100. Anchor 116 also has a base 804, extending generally perpendicularly from the ridged supporter 800, along a union. The base 804 is structured and arranged with a provided fastener 806 to affix the base 804 to a surface.

For at least one embodiment, the anchor 116 includes a weep notch 808 adjacent to the union. In other words the weep notch 808 is an angled or tapered groove disposed at least partially in the union. The weep notch 808 is structured and arranged to direct accumulated water or moisture towards either edge and thus avoid pooling along the union.

The base 804 has an underside 810. In at least one embodiment, this underside 810 has a water sealing material (shown as wavy lines 812) disposed thereon and structured and arranged to form a generally water tight seal when the base 804 is affixed by the fastener 806 to the surface.

For at least one embodiment the water sealing material 812 is a roofing mastic. Further the roofing mastic may be pre-selected as appropriate for different areas of the country. Moreover, it is understood and appreciated that as the anchor 116 is metal, as is the SAMS 100, and both are exposed upon a surface such as a roof, during at least a portion of the year the anchor will likely become warm such that the water sealing material may partially liquefy and further bond the anchor to the surface.

In yet another embodiment, the underside 810 has at least one gripper 814 structured and arranged to grip the surface when the base 804 is affixed by the fastener to the surface. In still yet another embodiment, the underside 810 has both the water sealing material 812 and at least one gripper 814.

Moreover, for at least one embodiment the gripper 814 is provided by one or more protrusions 816 extending from the underside 810 of the base 804. These protrusions 816 may be arranged in row, or one or more circles as shown, and/or randomly. Further, for at least one embodiment at least one protrusion 816 has a sharpened distal end.

As some installations of SAMS 100 may be upon surfaces covered with somewhat slick materials such as, but not limited to tile, the gripper 814, e.g. protrusions 816, may serve to assist in the installation process by providing the anchor 116 with at least some ability to hold to the surface before the fastener 806 is employed. Indeed the gripper 814 is intended to help bite the surface during installation and in so doing help the installer with positioning and aligning SAMS 100 upon the surface. When the fastener 806 is engaged, the grippers 814 serve to further couple the anchor 116 to the surface as they forcibly disposed into the surface.

As may be appreciated in FIGS. 8A-8D, for at least one embodiment, the ridged supporter 800 is a first arm 818 having a longitudinal axis 820 between a first end 822 and a second end 824. The first arm 818 has an elongated aperture 826 about the longitudinal axis 820 and disposed proximate to the first end 822 and extending towards the second end 824. For at least one embodiment, the first arm 818 has a length of about 8", a width of about 2.75", a thickness of about 0.25" and the elongated aperture has a width of about 0.343" and a length of about 3.5".

Further, for such an embodiment, the base 804 is a second arm 828 extending generally perpendicularly from the second end 824 of the first arm 818. The second arm 828 has a first side 830 and a second side 832 and at least a first opening 834 generally parallel to the first arm 818 between the first side 830 and a second side 832. For at least one embodiment, the second arm 828 has a length of about 4", a width of about 2.75", a thickness of about 0.25" and the first opening 834 is a hole having a diameter of about 0.343" disposed generally in the center of the second arm 828.

Moreover, for at least one embodiment the ridged supporter 800 and the base 804 are a section of "L" channel. As is also shown in FIG. 8, for at least one embodiment the fastener 806 is a bolt 836 having a head section 838 and a threaded section 840, the threaded section 840 being disposed through the first opening 834 and into a structure to achieve attachment. More specifically, for at least one embodiment, the fastener 806 is a lag screw, and specifically a 7/16 lag screw having a length of about 5".

For at least one embodiment, such as where SAMS 100 is to be installed in a high wind environment, additional first openings 834 and fasteners 806 may be provided. In addition, these additional first openings 834 may be spaced and or angled so as to increase the holding force provided by fasteners 806 as they are disposed into a structural member, such as a rafter 108. And again, for at least one embodiment, fasteners 806 with a proprietary drive head may be employed.

For at least one embodiment, the fastener 806, i.e., bolt 836, is pre-positioned in the first opening 834 with a sacrificial material 842. More specifically, as shown the sacrificial material 842 is disposed about the threaded section 840 and the first opening 834. In varying embodiments, the sacrificial material 842 is selected from glue, mastic, foam, wax, or other such material.

Moreover, sacrificial material 842 is intended to temporarily hold the fastener 806 prior to installation, but will not impede the fastener in making contact with the base 804, or a water sealing washer 844 as may be employed between the head section 838 and the base 804. In at least one embodiment, the sacrificial material 842 is biodegradable.

As is also shown in FIG. 8, for at least one embodiment, the base 804 has an annular raised barrier 846 about the first opening 834. This raised barrier 846 may assist in securing the sacrificial material 842. This raised barrier 846 will also provide a barrier to water upon the base 804 from reaching the fastener 806 and or the first opening 834.

FIG. 9 further illustrates embodiments of the anchor 116 in perspective view so as to further assist in appreciating the elements and their relationship. More specifically, shown in the top row is a first embodiment of anchor 116, e.g. anchor 900, first illustrating at the far left the ridged supporter 800, the base 804, the weep notch 808, the water sealing material 812 upon the underside 810 of the base, the grippers 814, and the fastener 806 along with the sacrificial material 842 separate from the base 804.

For anchor 900, the fastener 806 is shown to be a lag bolt with a head section 838 and a threaded section 840. In addition the water sealing washer 844 is shown disposed about the threaded section 840. In the middle illustration, the fastener 806 has been partially disposed in the first opening of the base 804 and temporarily affixed in place by the sacrificial material 842.

In the top right illustration, the fastener 806 is shown deployed through the first opening 834 as it would be to fasten the anchor 900 to a surface. As shown, the sacrificial material 842 is not impeding contact between the head section 838, the water sealing washer 844 and the base 804. Moreover, as the sacrificial material 842 has served its purpose of temporarily holding the fastener 806 and has now been washed, wiped, blown or otherwise removed.

In the bottom row is shown a similar progression of figures for a second embodiment of anchor 116, e.g. anchor 902, first illustrating at the far left the ridged supporter 800, the base 804, the weep notch 808, the water sealing material 812 upon the underside 810 of the base, the grippers 814 and the fastener 806 along with the sacrificial material 842 separate from the base 804.

In addition, the raised barrier 846 about the first opening 834 is also shown. For anchor 902, the fastener 806 is also shown to be a lag bolt with a head section 838 and a threaded section 840. In addition the water sealing washer 844 is shown disposed about the threaded section 840.

In the middle illustration, the fastener 806 has been partially disposed in the first opening of the base 804 and temporarily affixed in place by the sacrificial material 842. For anchor 902, the raised barrier 846 serves to assist with holding the sacrificial material 842 properly in place and may further serve to protect it until such time as the fastener 806 is deployed.

In the bottom right illustration, the fastener 806 is shown deployed through the first opening 834 as it would be to fasten the anchor 900 to a surface. The head section 838 is now recessed behind the raised barrier 846 and therefore further protected from water or moisture moving across the base 804.

As in the top row, the sacrificial material 842 is not impeding contact between the head section 838, the water sealing washer 844 and the base 804. Moreover, as the sacrificial material 842 has served its purpose of temporarily holding the fastener 806 and has now been washed, wiped, blown or otherwise removed.

Of course for an embodiment of anchor 116 wherein the sacrificial material 842 is not employed, or where for a particular installation it is desired to pre-drill a hole to receive the fastener 806, the installer simply provides the fastener 806 through the first opening 834 at the time of installation.

FIG. 10 presents a side cut through illustration for the first embodiment of anchor 116, e.g. anchor 900 further illustrating the vertical adjustment. For ease of illustration and discussion, the scale of anchor 900 and more specifically the ridged supporter 800, i.e., first arm 818 has been compressed.

As may be appreciated in FIG. 10 the first anchor 900 has been attached by bolt 1000 to the first rail 110 of SAMS 100 at about the top of the elongated aperture 826, e.g. proximate to first end 822. In other words, first anchor 900 has been adjusted down. In contrast, the second anchor 900' has been adjusted upward such that the attaching bolt 1000' affixing the second anchor 900' to the second rail 118 of SAMS 100 is at the bottom of the elongated aperture 826. Moreover there is a difference in vertical height adjustment 1002 between first anchor 900 and second anchor 900'.

It should be noted that even when anchor 900' is in this upper position, the first end 822 is below the top of friction locking retainer 112. Such a configuration reduces, if not eliminates, the possibility that an anchor 116 might inadvertently contact the underside of a photovoltaic module 102 (not shown, see FIGS. 1 & 7).

To summarize, with respect to FIGS. 8-10, provided by at least one embodiment, is an anchor 116 for anchoring at least a portion of SAMS 100 to a surface 104. This anchor 116 includes a ridged supporter 800 having a predetermined length structured and arranged to permit vertical height attachment and adjustment of at least a portion of SAMS 100. The anchor 116 has a base 804 coupled to the ridged supporter 800, the base 804 structured and arranged to affix the base 804 to a surface 104 with a fastener 806, the base 804 having an underside 810 having a water sealing material 812 disposed thereon and structured and arranged to form a generally waterproof seal when the base 804 is affixed by the fastener 806 to the surface 104.

For yet another embodiment is an anchor 116 for anchoring at least a portion of SAMS 100 to a surface 104. This anchor 116 includes a ridged supporter 800 having a predetermined length structured and arranged to permit vertical height attachment and adjustment of at least a portion of SAMS 100. The anchor 116 has a base 804 coupled to the ridged supporter 800, the base 804 structured and arranged to affix the base 804 to a surface 104 with a fastener 806, the base 804 having an underside 810 having at least one gripper 814 structured and arranged to grip into the surface 104 when the base 804 is affixed by the fastener 806 to the surface 104.

And for another embodiment is an anchor 116 for anchoring at least a portion of SAMS 100 to a surface 104. This anchor 116 includes a ridged supporter 800 having a predetermined length structured and arranged to permit vertical height attachment and adjustment of at least a portion of SAMS 100. The anchor 116 has a base 804 coupled to and extending generally perpendicularly from the ridged supporter 800 along a union having a weep notch 808 disposed at least partially therein, the weep notch 808 structured and arranged to direct water away from the anchor 116 when the base 804 is affixed to a surface 104 with a fastener 806.

Friction Locking Retainer

As shown in FIG. 1, SAMS 100 has a plurality of friction locking retainers 112. The friction locking retainers 112 are structured and arranged so as to permit an installer to place then in desired positions upon the first rail 110 and second rail 118 and subsequently slide a photovoltaic module 102 generally into place during installation. More specifically each friction locking retainer 112 is structured to provide a clamping element that is at the proper height to receive the photovoltaic module 102 such that the installer does not have to hold both the photovoltaic module 102 and the clamp.

Further, the friction locking retainer 112 is structured to provide enough frictional hold upon an photovoltaic module 102 to permit adjustment and fine tune alignment of the photovoltaic module 102 prior to being tightened for a long lasting hold. Further still, the friction locking retainer 112 is structured to provide enough frictional hold upon its supporting rail (either the first rail 110 or the second rail 118) to permit adjustment in placement by an installer and remain in place while a photovoltaic module 102 is set into place.

Figure 11A:
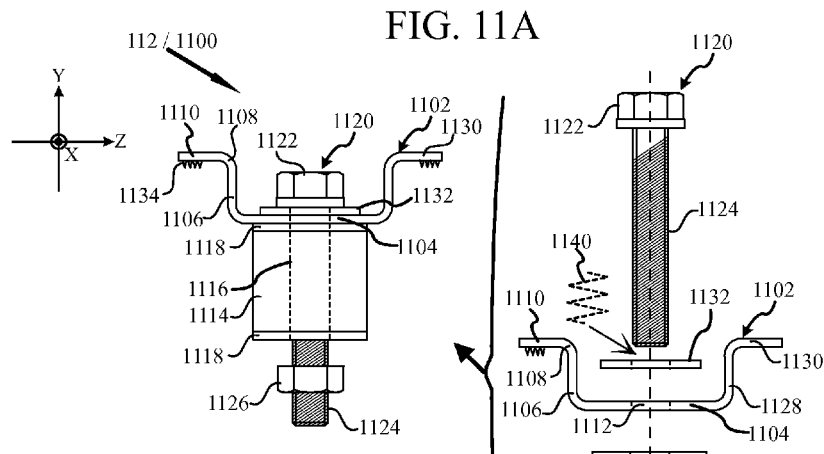
FIGS. 11A-11C shows a friction locking retainer for a self-aligning mounting system for photovoltaic modules according to at least one embodiment of the present invention.
Figure 11B:
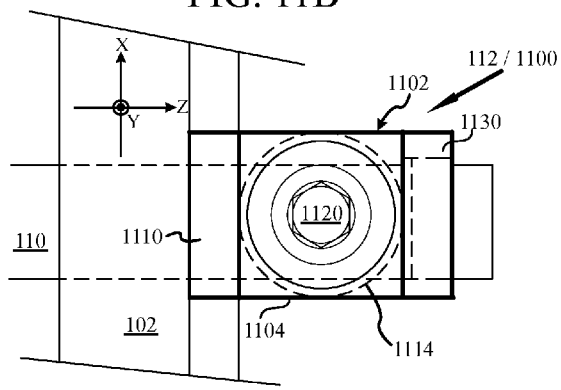
Figure 11C:
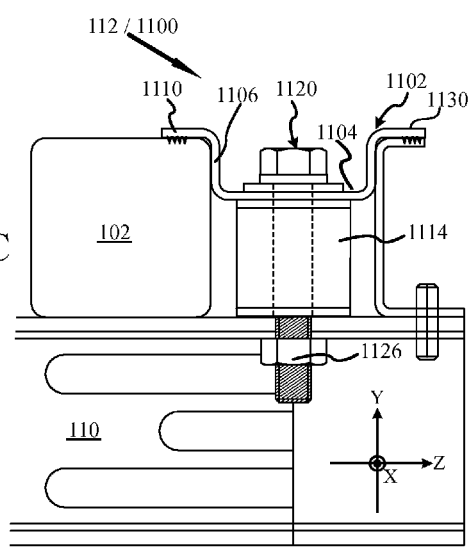
Figure 12A:
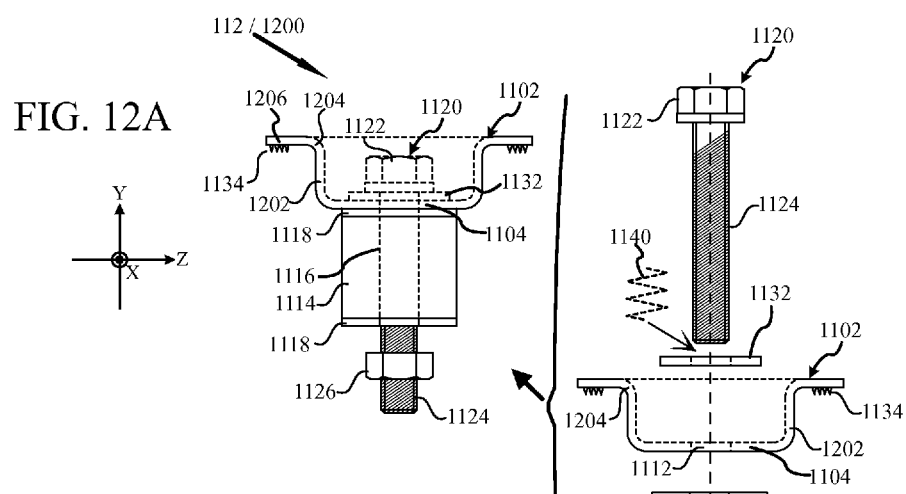
FIGS. 12A-12C shows a friction locking retainer for a self-aligning mounting system for photovoltaic modules according to at least one alternative embodiment of the present invention.
Figure 12B:
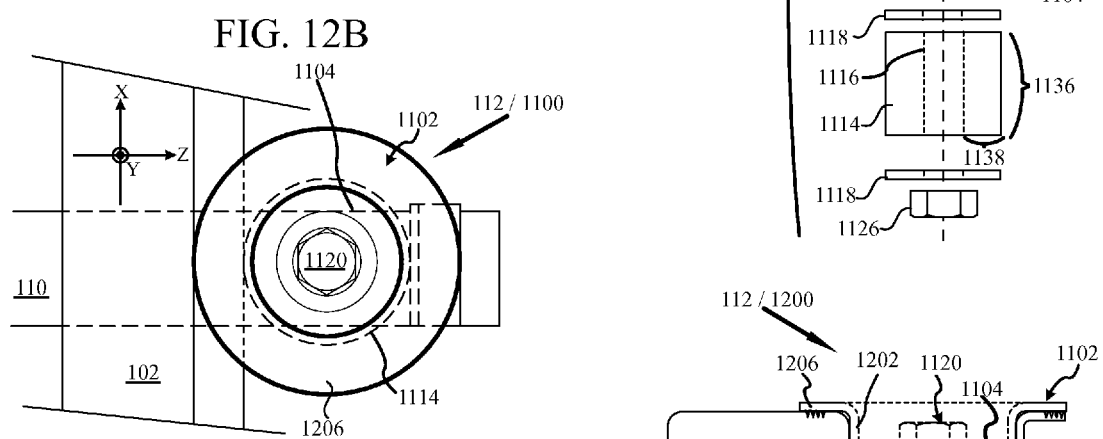
Figure 12C:
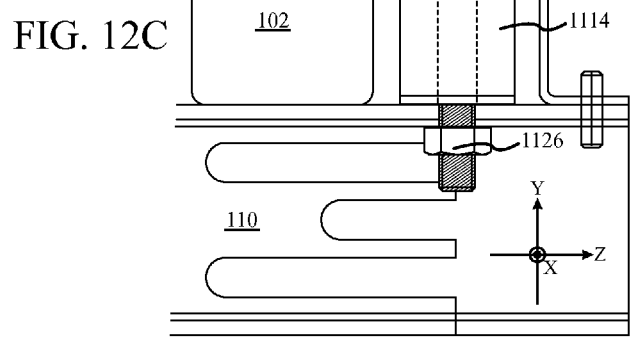

FIGS. 11A and 12A are provided to further illustrate embodiments of friction locking retainers 112 in accordance with the present invention. More specifically, FIG. 11A presents a set of detailed illustrations for friction locking retainer 112 according to at least one embodiment, e.g., friction locking retainer 1100.

As shown and described most easily with respect to the exploded view adjacent to the assembled view, friction locking retainer 1100 has a clamp 1102, having a central portion 1104 defined by at least one generally vertical wall 1106. The vertical wall 1106 has a distal end 1108 with a flange 1110 transverse to the vertical wall 1106 and extending away from the central portion 1104. The central portion 1104 also has a first opening 1112.

Friction locking retainer 1100 also has a first elastomer element 1114 disposed below the first opening 1112 opposite from the central portion 1104. The elastomer element 1114 has a central passage 1116 that is aligned to the first opening 1112. Washers 1118 may be disposed at either end of the first elastomer element 1114.

A bolt 1120 having a head section 1122 and a threaded section 1124 is disposed to pass through the first opening 1112 of the clamp 1102 and the central passage 1116 of the elastomer element 1114. A nut 1126 is disposed about the threaded section of the bolt 1120 extending from the central passage 1116.

It should be understood that the rising vertical wall 1106 and associated flange 1110 may take a variety of forms. For example and not by way of limitation, in at one embodiment, there is a single generally vertical, generally flat wall 1106 and associated flange 1110 located to one side of the central portion 1104.

In yet another embodiment, there are two generally vertical, generally parallel walls 1106, 1128 on either side of the central portion 1104—the first vertical wall 1106 having a first flange 1110 and the second vertical wall 1128 having a second flange 1130.

For yet another embodiment, the vertical wall 1106 is a generally annular vertical wall 1202 as shown with respect to friction locking retainer 1200 in FIG. 12A. For friction locking retainer 1200 the generally annular vertical wall 1202 has a distal end 1204 with a generally circular flange 1206 transverse to the annular vertical wall 1202 and extending away from the central portion 1104. The other components of friction locking retainer 1200 are substantially the same as those of friction locking retainer 1100 in FIG. 11A. Of course, it is understood and appreciated that generally circular flange 1206 may be replaced by a flange having a geometric shape, such as but not limited to, a square, a pentagon, or a hexagon.

For any of these variations, in accordance with at least one embodiment, the clamp 1102 is provided by forming 14 gauge metal, such as stainless steel, so that the clamp 1102 has a height of about 0.553", a length of about 1.45" across the central portion 1104, and an overall length of not more than about 2.311". The first opening 1112 is a circular hole having a diameter of about 0.343"

For at least one embodiment, at least one washer 1132 is disposed between the head section 1122 and the central portion 1104. Additional washers (not shown) may also be disposed between the head section 1122 and the central portion 1104, the elastomer element 1114 and the clamp 1102 and/or the elastomer element 1114 and the nut 1126.

As is also shown in FIGS. 11A, 12A, in optional embodiments each flange has a plurality of teeth 1134 oriented generally towards the threaded section 1124 of the bolt 1120. These teeth 1134 are structured and arranged to enhance the grip provided by the clamp 1102 upon the photovoltaic module 102.

In addition, as these teeth 1134 may cut slightly into the edge of the of the photovoltaic module 102 and therefore penetrate an outer coating of paint or other material, where the frame of the photovoltaic module 102 is metal the teeth 1134 will improve the general electrical conductivity, and more specifically the electrical grounding between the photovoltaic module 102 and the SAMS 100.

For at least one embodiment the first elastomer element 1114 is a spring. For yet another embodiment the elastomer element is a non-metallic element, such as but not limited to, rubber, foam or silicon.

The first elastomer element 1114 has a predetermined length 1136 about the thickness of the photovoltaic module 102. As the clamp 1102 has at least one vertical wall 1106 (FIG. 11), 1202 (FIG. 12) and at least one flange 1110, 1206, these elements contribute to the overall height of the friction locking retainer 1100, 1200 such that the predetermined length 1136 in most embodiments does not need to be the same as the thickness of the photovoltaic module 102.

Moreover, in general the predetermined length 1136 may typically be from about half the thickness of the photovoltaic module 102 to the about the thickness of the photovoltaic module 102. For at least one embodiment the first elastomer element 1114 has a predetermined length 1136 of about three-quarters the thickness of the photovoltaic module 102.

Further the first elastomer element 1114 has a sidewall thickness 1138 selected to be about the distance from the bolt 1120 to the at least one vertical wall 1106, 1202. Moreover, in accordance with at least one embodiment the elastomer element provides generally continuous support to the underside of the central portion 1104 of the clamp 1102.

The first elastomer element 1114 has resilient properties. It can be compressed and it's expansive force when compressed assists in creating the friction force to hold the friction locking retainer 1100, 1200 in the location selected by the installer.

For yet another optional embodiment, a second elastomer element 1140 (shown in dotted relief) may be disposed between the head section 1122 and the central portion 1104 of the clamp 1102. This second elastomer element 1140 may be a coiled spring, and in at least one embodiment permits generally vertical displacement of the clamp 1102 by about one-half inch. In addition, this second elastomer element imparts a biasing force of about 3 pounds.

FIGS. 11B, 11C and 12B, 12C also provide top and side views of friction locking retainers 1100 and 1200 with respect to first rail 110 and a portion of a photovoltaic module 102 to further illustrate how each receives and grasps a photovoltaic module 102. It should be appreciated that once the installer has positioned the photovoltaic module(s) 102, bolt 1120 is tightened to provide a solid mounting of the photovoltaic module(s) 102 to the SAMS 100.

At this point, the first elastomer element 1114 is no longer needed. Indeed it's degradation over time through exposure to the elements is of no significance to the structural integrity of the mounted photovoltaic module 102. If the optional second elastomer element 1140 is provided, one or more additional washers or other elements may also be provided such that when compressed by firmly securing the bolt 1120, the second elastomer element 1140 is recessed and any degradation of the second elastomer element 1140 will not adversely affect the structural integrity of the mounted photovoltaic module 102.

To summarize, with respect to FIGS. 11 and 12, provided by at least one embodiment is a friction locking retainer 112 for SAMS 100, having a clamp 1102 having a central portion 1104 defined by at least one generally vertical wall 1106 having a distal end 1108 with a flange 1110 transverse to the wall 1106 and extending away from the central portion 1104. The central portion 1104 also has a first opening 1112. A first elastomer element 1114 is disposed below the first opening 1112 opposite from the central portion 1104, the elastomer element 1114 having a central passage 1116 aligned to the first opening 1112. A bolt 1120 having a head section 1122 and a threaded section 1124 is disposed to pass through the first opening 1112 and the central passage 1116 of the elastomer element 1114 and a nut 1126 is disposed about the threaded section 1124 of the bolt 1120 extending from the central passage 1116.

For another embodiment, provided is a friction locking retainer 112 for SAMS 100, and more specifically friction locking retainer 1200 having a clamp 1102 having a central portion 1104 defined a generally annular generally vertical wall 1202 having a distal end 1204 with a generally circular flange 1206 transverse to the annular wall 1202 and extending away from the central portion 1104. The central portion 1104 also has a first opening 1112. A first elastomer element 1114 is disposed below the first opening 1112 opposite from the central portion 1104, the elastomer element 1114 having a central passage 1116 aligned to the first opening 1112. A bolt 1120 having a head section 1122 and a threaded section 1124 is disposed to pass through the first opening 1112 and the central passage 1116 of the elastomer element 1114 and a nut 1126 is disposed about the threaded section 1124 of the bolt 1120 extending from the central passage 1116.

Removable Water Cap

Returning to FIG. 1, as noted above, SAMS 100 is attached to a surface 104 such as a roof with the use of a plurality of anchors 116. As the anchors 116 have fasteners that penetrate into the surface 104, there is a possibility that these points of penetration may permit water to penetrate the surface as well if not otherwise sealed.

The application of a removable water cap 128 structured and arranged to cap the fastener portion of the anchor 116 may advantageously reduce if not eliminate the opportunity or water to reach the points of penetration.

FIGS. 13-16 further illustrate embodiments of a removable water cap 128. FIG. 13A presents top view, FIG. 13B presents side view and FIG. 13C presents a front view of a removable water cap 128 according to at least one embodiment.

Figure 16:
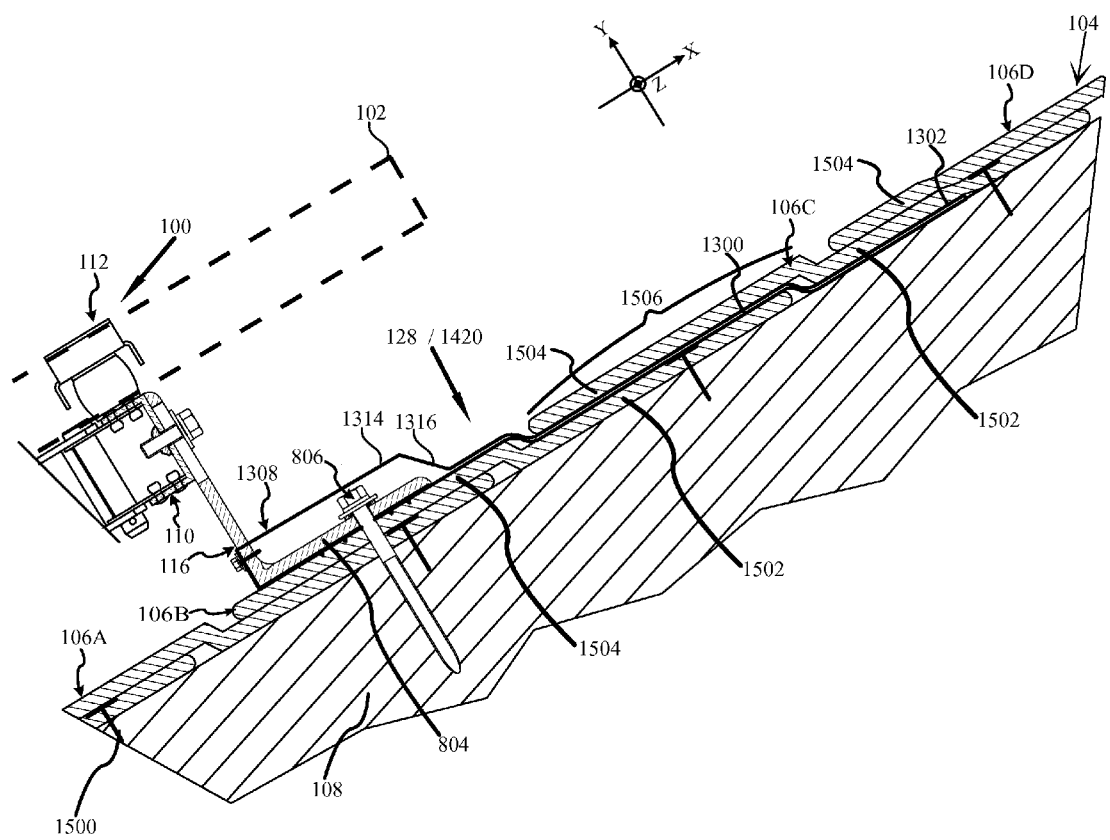
FIG. 16 is the side view partial cut through of FIG. 15 now showing the removable water cap as installed upon a fastener for retaining a self-aligning mounting system for photovoltaic modules to a surface according to at least one embodiment of the present invention.

More specifically, with respect to FIG. 13A-C for at least one embodiment it is appreciated that the removable water cap 128 has a base 1300 having a first end 1302 structured and arranged to fit between at least two roof shingles 106 as is further shown in FIG. 16. In addition, the removable water cap 128 has a second end 1304 opposite from the first end 1302 that is structured and arranged to receive and generally seal the fastener 806 of an anchor 116 and permit the undersurface of the base 1300 to be generally in consistent contact with at least one underlying shingle 106.

Moreover the base 1300 may be generally viewed as defining a plane 1306. The first end 1302 is substantially flat and therefore may be disposed between two shingles 106 by an installer, as shown below with respect to FIGS. 15 and 16. The second end 1304 provides an enclosure 1308 that will enclose the fastener 806 of an anchor 116. As shown, the enclosure 1308 has in general two sides 1310, 1312, a top 1314 and a front 1316 rising above the plane 1306 of the base 1300.

The enclosure 1308 has an opening 1318 opposite from the front 1316, and disposed proximate to the distal end 1320 of the second end 1304. In addition, for at least one embodiment the enclosure 1308 has at least one bendable tab 1322 normal to the plane 1306 and initially extending away from the opening 1318. As shown, for at least one embodiment there is a second bendable tab 1324 opposite from the first bendable tab 1322, such that each is on either side of the opening 1318 of the enclosure 1308.

For at least one embodiment, the front 1316 is angled relative to the longitudinal axis 1326 of the base 1300. In addition, for yet another embodiment the front 1316 is angled relative to the latitudinal axis 1328 of the base 1300. Moreover, in varying embodiments, the front 1316 may be square of angled in at least one or two directions so as to deflect water away from the removable water cap 128. In addition, for at least one embodiment the base 1300 has a water sealing material 1330 disposed on the underside 1332 and structured and arranged to form a generally water tight seal when the first end 1302 is disposed between shingles 106.

In addition, as is appreciated most easily with respect to FIGS. 13A and 13C, second end 1304 has a first side area 1334 and a second side area 1336 on either side of the enclosure 1308. For at least one embodiment, the first side area 1334 and the second side area 1336 are non-formed portions of the base 1300 and therefore lie generally in the plane 1306 of the base 1300 as the enclosure 1308 rises above.

Moreover, first side area 1334 and second side area 1336 provide continued contact with at least one shingle 106 on either side of the enclosure 1308 when water cap 128 is installed. For embodiments of water cap 128 having water sealing material 1330 disposed on the underside 1332, the first side area 1334 and the second side area 1336 further establish water tight seals along the sides of the anchor 116.

To further appreciate the arrangement of elements providing the removable water cap 128, FIGS. 14A-14C provides perspective views of varying embodiments of removable water cap 128, specifically removable water cap 1400, and removable water cap 1420.

As set forth in the description of FIG. 13, each embodiment of removable water cap 1400 and 1420 has a base 1300 having a first end 1302 and a second end 1304 with an enclosure 1308, having a first side 1310 (second side 1312 not shown), top 1314, and front 1316 proximate to the distal end 1320 of the second end 1304. Further the enclosure 1308 is appreciated to have two bendable tabs 1322, 1324.

As shown in FIG. 14A, removable water cap 1400 has been sized to snuggly fit over the fastener 806 of anchor 116. Further, bendable tabs 1322, 1324 may be bent around the ridged supporter 800 of the anchor 116 so as to at least temporarily affix the removable water cap 1400 to the anchor 116.

For at least one embodiment, bendable tab 1324 has an aperture 1402 which has been pre-positioned to align to a hole (not shown) in the ridged supporter 800 of anchor 116/900/902 so that a fastener, such as a sheet metal screw, may further affix the removable water cap 1400 to the anchor 116.

The embodiment of removable water cap 1420 shown in FIGS. 14B and 14C is substantially identical to that of water cap 1400 with yet the additional feature of a receiver 1422 disposed within and joined to the enclosure 1308. The receiver 1422 is structured and arranged to snap fit over the fastener 806. As shown most clearly in FIG. 14B, for at least one embodiment, the receiver 1422 is joined to the underside of the top 1314.

As is shown in FIG. 14C, the receiver 1422 is pre-positioned to engage the fastener 806, or for at least one embodiment, the raised barrier 846 surrounding the fastener 806. Indeed, the raised barrier 846 may have one or more holes, notches grooves or other structural elements fashioned to receive a spring pint, snap clip or other latching device provided by the receiver 1422. In varying embodiment, the receiver 1422 may further include water proofing material such as but not limited to, silicone gel, foam, cloth or cork.

Figure 15:
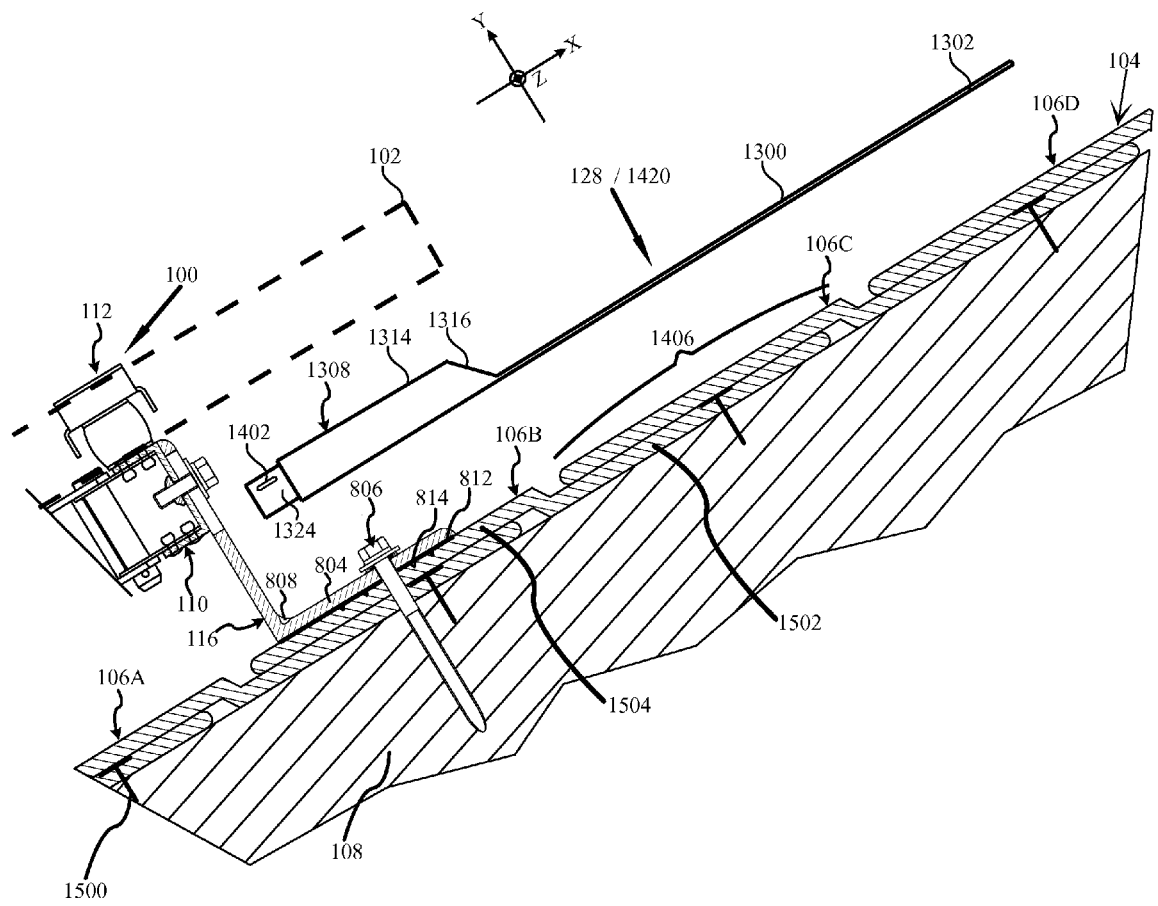
FIG. 15 is a side view partial cut through showing a removable water cap prior to installation upon a fastener for retaining a self-aligning mounting system for photovoltaic modules to a surface according to at least one embodiment of the present invention.

FIGS. 15 and 16 provide side views further illustrating the intended use of the removable water cap 128, and more specifically an embodiment substantially the same as removable water cap 1420.

In FIG. 15, an anchor 116 is shown affixed by fastener 806 to surface 104. The anchor 116 is further shown to be supporting a portion of a first rail 110 of SAMS 100, and a friction locking retainer 112 is also shown ready to receive at least one photovoltaic module 102 shown in dotted line as it is not yet mounted.

The surface 104 is a roof, covered with a plurality of overlapping shingles 106, of which shingles 106A, 106B, 106C and 106D are exemplary. These shingles 106A-D have been affixed in place by a plurality of nails 1500.

With respect to the shingles 106, typically at least one nail 1500 is driven through the tail portion 1502 of the shingle 106. As the shingles 106 overlap, the front portion 1504 of the upper shingle, e.g. shingle 106C, overlaps the tail portion 1502 of the lower shingle, e.g. shingle 106B, and covers the nail 1500.

In many instances, such as with asphalt or composite shingles, at least one layer of sealing mastic is pre-applied to at least the underside of each shingle 106 proximate to where the nail 1500 is likely to be placed as well as the leading edge of each shingle 106. These areas of sealing mastic are typically applied by the shingle manufacturer. As the shingles warm in the sun this layer of mastic facilitates bonding between the shingles and helps to achieve a greater water tight seal for the structure as provided at least in part by the shingles 106.

The anchor 116 is shown disposed upon the front portion 1504 of shingle 106BC. The fastener 806 of anchor 116 is shown to have engaged a roof rafter 108 so as to provide firm support for SAMS 100. The pitch of the roof in FIGS. 14 and 15 has also been adjusted to more naturally appear as a typical roof—and as shown, it is appreciated that the base 804 of the anchor 116 is oriented generally up the roof line.

In this orientation, the water redirection properties of the weep notch 808 may also be further appreciated. In addition, the grippers 814 of the base 804 are shown partially disposed into a shingle 106B and the water sealing material 812 is firmly disposed between the base 804 and the shingle 106B.

As may be appreciated with reference to FIG. 1, there are typically seam lines 132 between the shingles. Due to random opportunity, it is entirely possible that a seam line 132 for shingles 106 directly above the anchor 116 may be at least partially adjacent to an anchor 116. In FIG. 15, shingle 106A has such a seam line, the location and length of which is suggested by bracket 1506, but shingle 106B does not.

In FIG. 16, the removable water cap 1420 is shown installed. More specifically the first end 1302 of the base 1300 has been inserted between shingles 106B and 106C. As is shown, removable water cap 1420 has a length that is greater than the exposed front portion 1504 of shingle 106C, such that first end 1302 is actually positioned under the tail portion 1502 of shingle 106C and at least a portion of the front portion 1504 of shingle 106D. Moreover, the first end 1302 of the base 1300 has extended past the seam line 1506. As such the removable water cap 1420 prevents any water permitted through seam line 1506 from reaching the anchor 116.

In addition, as is clearly shown in FIG. 16, the removable water cap 1420 has not disrupted the nails 1500 holding any of the shingles 106.

As is further discussed below, the base 1300 is constructed from a generally stiff, but also pliable material. More specifically, the base 1300 is formed from a material selected from the group of, but not exclusively limited to, aluminum, plastic, polycarbonate, copper, lead, and rubber.

For at least one embodiment, the base 1300 is formed from aluminum. Further the aluminum is selected to have a thickness permitting manual cutting by an installer in the field. The aluminum is also stiff enough to be placed between shingles, but compliant enough to bend subtly and conform to the shingle contour as shown in FIG. 15.

Moreover, for at least one embodiment the base 1300 is formed from anodized aluminum sheet having a thickness of 0.050 inches thick, the base 1300 having a length of about 14 inches and a width of about 6 inches. For such an embodiment, the enclosure 1308 has a height of about 0.75 inches, a width of about 2.875 inches and a length of about 4.0 inches.

To summarize, with respect to FIGS. 13-16, provided by at least one embodiment is a removable water cap 128 to cap a fastener 806 retaining SAMS 100. The removable water cap 128 includes a base 1300 having a first end 1302 structured and arranged to fit between at least two roof shingles 106; and a second end 1304 opposite from the first end 1302, the second end 1304 structured and arranged to receive and generally seal the fastener 806, and permit an undersurface of the base 1300 to be generally in consistent contact with at least one underlying shingle 106.

For another embodiment, provided is a removable water cap 128 to cap a fastener 806 retaining SAMS 100 to a surface 104 having a base 1300 having a first end 1302 and opposite thereto a second end 1304, the base generally defining a plane 1306; the first end 1302 structured and arranged to fit between at least two roof shingles 106. The removable water cap 128 has an enclosure 1308 having generally two sides 1310 & 1312, a top 1314 and front 1316 formed in the second end 1304 and rising above the plane 1306. The enclosure 1308 has an opening 1318 opposite from the front 1316 and disposed proximate a distal end 1320 of the second end 1304 and at least one bendable tab 1322 generally normal to the first plane 1306 and extending away from the opening 1318.

Figure 17:
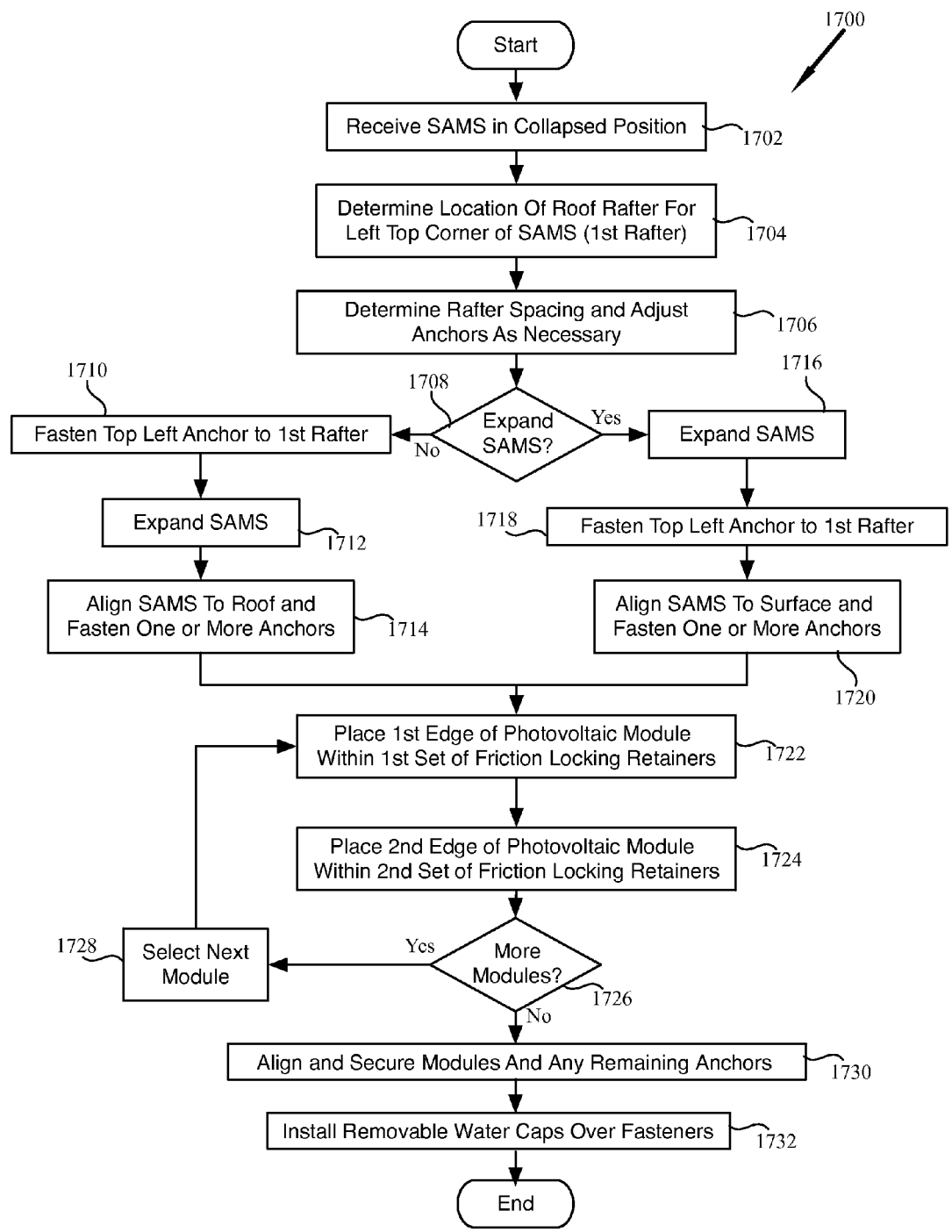
FIG. 17 is a flow diagram showing a method of installing a self-aligning mounting system for photovoltaic modules to a surface according to at least one embodiment of the present invention.

FIG. 17, in connection with FIGS. 1-16 provides a high level flow diagram depicting a method 1700 for mounting at least one photovoltaic module 102 to a surface 104. It will be appreciated that the described method need not be performed in the order in which it is herein described, but that this description is merely exemplary of one method of mounting a photovoltaic module 102.

In general, method 1700 commences with receiving at least one SAMS 100 as described above in the initial collapsed position, block 1702. For at least one embodiment SAMS 100 is provided with substantially all necessary mounting hardware already attached. If one or more elements have come loose during shipment to the installation site they can be easily reattached by the installer.

Method 1700 continues by determining the location of at least one rafter 108 ($1^{st}$ rafter) for a corner anchor 116 of SAMS 100, block 1704. For at least one embodiment, this first anchor is selected to be the top left anchor 116 of SAMS 100. In addition the spacing of the rafters 108 is determined and adjustments to the placements of anchors 116 may be made as necessary to accommodate the spacing, i.e., 12" on center, 16" on center, or 24", block 1776.

As noted above, in many instances photovoltaic modules 102 are mounted upon surfaces 104 that are roofs, requiring the installers to ferry all elements for the installation from the ground to the roof. As SAMS 100 is initially in a compact state, for some installations it may be desired to transport SAMS 100 to the roof in the compact state. Moreover, method 1700 permits the installer to adapt, should SAMS be expanded before attachment or not—decision 1708.

For the same of example, in a first instance, the choice is to attach SAMS 100 and then expand. As such method 1700 proceeds with the installer attaching the left anchor 116 to the 1$^{st}$ rafter 108, block 1710. With the first anchor 116 attached, the installer then expands SAM 100, block 1712. With the cross bars now in the aligned position as discussed above, the installer proceeds to align SAMS 100 to the roof and attaches one or more anchors 116, block 1714.

For the sake of an alternative example, such as where the surface 104 is not overly slanted and/or easily accessible from the ground, for some installations it may be desired to pre-expand SAMS 100 prior to installation. As such, following decision 1708, the installer proceeds to expand SAMS 100, block 1716. With SAMS 100 now expanded, SAMS 100 is disposed on the surface and the installer fastens the top left anchor 116 to the 1$^{st}$ rafter 108, block 1718.

With the first anchor 116 now attached, the installer aligns SAMS 100 to the surface and fastens one or more additional anchors 116, block 1720. Moreover, although ultimately all anchors 116 will be fully attached, during the installation process it may be beneficial to permit some amount of play and flexibility in SAMS 100. As the anchors 116 are pre-positioned they are easily aligned to rafters and may at least be partially attached by their respective fasteners 806.

With SAMS 100 now positioned and aligned, the first photovoltaic module 102 is installed. This is accomplished by placing a first edge of the photovoltaic module 102 within a first set of friction locking retainer 112, block 122. The installer then places the second edge of the photovoltaic module 102 within a second set of friction locking retainers opposite from the first set, block 1724. The installer may also use a placer 606 as shown above with respect to FIG. 6 to assist with proper overall alignment of the photovoltaic module 102 relative to SAMS 100.

If more photovoltaic modules 102 are to be installed, decision 1726, the installer selects the next photovoltaic module, block 1728, and repeats the processes of placing its first edge within the next set of friction locking retainers 112, block 1722.

Of course, if additional SAMS 100 are required to complete the full installation, in general they are installed and attached to the initial SAMS 100 before the installation process of the photovoltaic modules 102 commences.

When all photovoltaic modules 102 have been positioned on the one or more connected SAMS 100, the installer then aligns and secures each photovoltaic module, block 1730. Any anchors 116 not previously completely fastened are now secured. Removable water caps 128 are then installed over each fastener and secured, block 1732.

As SAMS 100 provides substantially all mounting hardware in a generally pre-positioned state, it is to be appreciated that SAMS 100 and method 1700 advantageously reduce the number of elements, such as but not limited to bolts, washer and nuts, that must be individually handled and assembled by one or more installers in the installation environment, such as a roof. By reducing these individual components, the opportunity to drop one or more components is significantly reduced. In light of human nature often being to reach for a dropped object, risks to the installers may also be reduced in environments such as roofs or other elevated and or angled locations. Further, as SAMS 100 utilizes generally the same size driver for substantially all components, the installers need not carry multiple drivers or change drive bits continuously—again a time savings and potential safety improvement for the installers.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall there between.

The invention claimed is:

1. A self-aligning system for mounting at least one photovoltaic module to a surface, comprising:
   a plurality of rails, each rail having a plurality of slideably attached friction locking retainers, and a plurality of anchors with fasteners extending opposite from the friction locking retainers;
   a collapsible separator coupled between the rails and structured and arranged to align the rails to each other at a pre-defined separation distance; and
   each friction locking retainer structured and arranged to laterally slide along a portion of one of the rails and remain as positioned by a user, each friction locking retainer further structured and arranged to grip and permit adjustment of at least one photovoltaic module during mounting.

2. The self-aligning system of claim 1, wherein mounting hardware is pre-positioned upon the self-aligning system prior to mounting upon a surface.

3. The self-aligning system of claim 1, wherein the collapsible separator is structured and arranged to align the rails for supporting and anchoring one or more photovoltaic panels and to provide the anchors at interval spacing selected to be about at 12" on center, 16" on center, or 24" on center.

4. The self-aligning system of claim 1, wherein the self aligning system is modular and structured and arranged to connect to additional self-aligning systems for mounting at least one photovoltaic module.

5. The self-aligning system of claim 1, wherein at least one of the rails is an L rail.

6. The self-aligning system of claim 1, wherein at least one of the rails is a C channel rail.

7. The self-aligning system of claim 1, wherein each rail has at least a longitudinal first channel along a first side structured and arranged to receive the plurality of friction locking retainers, and a longitudinal second channel along a second side, the second channel generally normal to the first channel, the second channel structured and arranged to receive the plurality of anchors.

8. The self-aligning system of claim 1, wherein each rail provides a first plurality of apertures in a first surface, each aperture of the first plurality of apertures structured and arranged to permit latter adjustment of at least one of the friction locking retainers relative to a longitudinal axis of the rail, and a second plurality of apertures in a second surface generally normal to the first surface, each aperture of the second plurality of apertures structured and arranged to permit lateral adjustment of at least one of the anchors relative to the longitudinal axis of the rail.

9. The self-aligning system of claim 1, wherein the anchors and rails are collectively structured and arranged to permit slideably vertical and lateral adjustment of each anchor.

10. The self-aligning system of claim 1, wherein each anchor further includes a surface gripper.

11. The self-aligning system of claim 1, wherein the collapsible separator is disengaged from at least one rail when collapsed.

12. The self-aligning system of claim 1, wherein the collapsible separator is provided by at least two cross bars structured and arranged to rotate between a first position of being generally parallel to the rails and a second position of being generally normal to the rails.

13. The self-aligning system of claim 1, wherein the collapsible separator includes at least one hinged body structured and arranged to lock when extended to at least one distance.

14. The self-aligning system of claim 1, wherein each photovoltaic module has a length, a center section of about 60% of the length and distal end portions each of about 20% of the length, the collapsible separator structured and arranged to align and separate the first and second rails by a distance of at least the center section.

15. The self-aligning system of claim 14, wherein the collapsible separator has multiple adjustable pre-defined lengths to accommodate different photovoltaic members having center sections of different lengths.

16. The self-aligning system of claim 1, wherein including a plurality of removable water caps, each water cap structured and arranged to cap at least one of the anchor fasteners when the fastener is affixed to a surface.

17. A self-aligning system for mounting at least one photovoltaic module to a surface, comprising:
   a first rail having a plurality of friction locking retainers slideably attached to a first side of the first rail, and a plurality of anchors with fasteners extending opposite from the first side of the first rail;
   a second rail having a plurality of friction locking retainers slideably attached to a first side of the second rail, and a plurality of anchors with fasteners extending opposite from the first side of the second rail;
   a collapsible separator coupled between the first rail and the second rail and structured and arranged to align the first rail and the second rail to each other at a pre-defined separation distance; and
   each friction locking retainer structured and arranged to laterally slide along a portion of each first side and remain as positioned by a user, each friction locking retainer further structured and arranged to grip and permit adjustment of at least one photovoltaic module during mounting.

18. The self-aligning system of claim 17, wherein for the plurality of anchors attached to the first rail, each anchor is slideably attached for lateral movement along a longitudinal axis of the first rail; and for the plurality of anchors second rail, each anchor is slideably attached for lateral movement along a longitudinal axis of the second rail.

19. The self-aligning system of claim 17, wherein the collapsible separator is structured and arranged to align the first rail to the second rail for supporting and anchoring one or more photovoltaic panels and to provide the anchors at interval spacing selected to be about at 12" on center, 16" on center, or 24" on center.

20. The self-aligning system of claim 17, wherein mounting hardware is pre-positioned upon the self-aligning system prior to mounting upon a surface.

21. The self-aligning system of claim 17, wherein at least one of the rails is an L rail.

22. The self-aligning system of claim 17, wherein at least one of the rails is a C channel rail.

23. The self-aligning system of claim 17, wherein each rail has at least a longitudinal first channel along a first side structured and arranged to receive the plurality of friction locking retainers, and a longitudinal second channel along a second side, the second channel generally normal to the first channel, the second channel structured and arranged to receive the plurality of anchors.

24. The self-aligning system of claim 17, wherein each rail provides a first plurality of apertures in a first surface, each aperture of the first plurality of apertures structured and arranged to permit latter adjustment of at least one of the friction locking retainers relative to a longitudinal axis of the rail, and a second plurality of apertures in a second surface generally normal to the first surface, each aperture of the second plurality of apertures structured and arranged to permit lateral adjustment of at least one of the anchors relative to the longitudinal axis of the rail.

25. The self-aligning system of claim 17, wherein each anchor further includes a surface gripper disposed on a pad opposite the fastener.

26. The self-aligning system of claim 17, wherein the collapsible separator is disengaged from at least one rail when collapsed.

27. The self-aligning system of claim 17, wherein the collapsible separator is provided by at least two cross bars structured and arranged to rotate between a first position of being generally parallel to the first and second rails and a second position of being generally normal to the first and second rails.

28. The self-aligning system of claim 17, wherein the collapsible separator includes at least one telescoping rod structured and arranged to lock when extended to at least a first position.

29. The self-aligning system of claim 17, wherein the collapsible separator includes at least one set of cables of at least one pre-defined length.

30. The self-aligning system of claim 17, wherein the collapsible separator includes at least one hinged body structured and arranged to lock when extended to at least one distance.

31. The self-aligning system of claim 17, wherein each photovoltaic module has a length, a center section of about 60% of the length and distal end portions each of about 20% of the length, the collapsible separator structured and arranged to align and separate the first and second rails by a distance of at least the center section.

32. The self-aligning system of claim 31, wherein the collapsible separator has multiple adjustable pre-defined lengths to accommodate different photovoltaic members having center sections of different lengths.

33. The self-aligning system of claim 17, further including a plurality of removable water caps, each water cap structured and arranged to cap at least one of the anchor fasteners when the fastener is affixed to a surface.

34. A self-aligning system for mounting at least one photovoltaic module to a surface, comprising:
   at least two mounting means for mounting at least one photovoltaic module;
   a collapsible alignment means for aligning the mounting means to one another at a pre-defined separation distance;
   an anchoring means for anchoring the mounting means to a surface; and
   a friction locking means permitting user adjustment in positioning along the mounting means and holding at least one photovoltaic module while permitting alignment of the photovoltaic module upon the mounting means.

35. The self-aligning system of claim 34, wherein a first mounting means is a first rail and a second mounting means is a second rail.

36. The self-aligning system of claim 35, wherein each rail has at least a longitudinal first channel along a first side structured and arranged to receive the plurality of friction locking retainers, and a longitudinal second channel along a second side, the second channel generally normal to the first channel, the second channel structured and arranged to receive the plurality of anchors.

37. The self-aligning system of claim 35, wherein each rail provides a first plurality of apertures in a first surface, each aperture of the first plurality of apertures structured and arranged to permit latter adjustment of at least one of the friction locking retainers relative to a longitudinal axis of the rail, and a second plurality of apertures in a second surface generally normal to the first surface, each aperture of the second plurality of apertures structured and arranged to permit lateral adjustment of at least one of the anchors relative to the longitudinal axis of the rail.

38. The self-aligning system of claim 34, wherein the collapsible alignment means has at least two positions, a first position wherein the at least two mounting means are disposed adjacent to each other such that the self-aligning system occupies a first amount of space, and a second position wherein the at least two mounting means are disposed apart and properly aligned to receive at least one photovoltaic module such that the self-aligning system occupies a second amount of space greater than the first amount of space.

39. The self-aligning system of claim 34, wherein the collapsible alignment means is provided by at least two cross bars structured and arranged to rotate between a first position of being generally parallel to the at least two mounting means and a second position of being generally normal to the at least two mounting means.

40. The self-aligning system of claim 34, wherein each photovoltaic module has a length, a center section of about 60% of the length and distal end portions each of about 20% of the length, the collapsible alignment means structured and arranged to align and separate the at least two mounting means by a distance of at least the center section.

41. A method for mounting at least one photovoltaic module to a surface, the method comprising:
providing a self-aligning mount having:
a first rail having a plurality of friction locking retainers slideably attached to a first side of the first rail, and a plurality of anchors with fasteners extending opposite from the first side of the first rail, the plurality of friction locking retainers including at least a first friction locking retainer;
a second rail having a plurality of friction locking retainers slideably attached to a first side of the second rail, and a plurality of anchors with fasteners extending opposite from the first side of the second rail, the plurality of friction locking retainers of the second rail including at least a first friction locking retainer corresponding to the first friction locking retainer of the first rail;
a collapsible separator coupled between the first rail and the second rail and structured and arranged to align the first rail and the second rail to each other at a pre-defined separation distance; and
each friction locking retainer structured and arranged to laterally slide along a portion of each first side and remain as positioned by a user, each friction locking retainer further structured and arranged to grip and permit adjustment of at least one photovoltaic module during mounting;
disposing the first rail upon a roof and aligning at least one anchor of the first rail to a roof rafter and affixing the aligned anchor to the rafter by the fastener;
expanding the collapsible separator to align and displace the second rail from the first rail by the pre-defined distance;
selecting at least one anchor of the second rail and aligning the selected anchor to a roof rafter and affixing the aligned anchor of the second rail to the rafter by the fastener;
placing a first edge of a first photovoltaic module within the first friction locking retainer of the first rail and the corresponding first friction locking retainer of the second rail;
adjusting, if necessary, the alignment of the photovoltaic module; and
securing the remaining anchors to rafters and securing the first friction locking retainers to bind the first edge of the first photovoltaic module.

42. The method of claim 41, further including placing a first edge of a second photovoltaic member within the first friction locking retainer of the first rail and the corresponding first friction locking retainer of the second rail opposite from the first photovoltaic member, prior to securing the first friction locking retainer.

43. The method of claim 41, further including disposing a removable water cap over each fastener.

44. The method of claim 41, wherein expanding the collapsible separator to align and displace the second rail is performed before aligning at least one anchor of the first rail to the roof and affixing the aligned anchor.

45. The method of claim 41, wherein expanding the collapsible separator to align and displace the second rail is performed after aligning at least one anchor of the first rail to the roof and affixing the aligned anchor.

46. The method of claim 41, wherein the collapsible separator is provided by at least two cross bars structured and arranged to rotate between a first position of being generally parallel to the first and second rails and a second position of being generally normal to the first and second rails.

47. The method of claim 41, wherein mounting hardware is pre-positioned upon the self-aligning system prior to mounting upon a surface.

48. The method of claim 41, wherein at least one of the rails is a C channel rail.

49. The method of claim 41, wherein each rail has at least a longitudinal first channel along a first side structured and arranged to receive the plurality of friction locking retainers, and a longitudinal second channel along a second side, the second channel generally normal to the first channel, the second channel structured and arranged to receive the plurality of anchors.

50. The method of claim 41, wherein the collapsible separator is disengaged from at least one rail when collapsed.

* * * * *